(12) United States Patent
Vigraham et al.

(10) Patent No.: US 10,084,414 B2
(45) Date of Patent: Sep. 25, 2018

(54) CIRCUITS AND METHODS FOR SWITCHED-MODE OPERATIONAL AMPLIFIERS

(71) Applicants: THE TRUSTEES OF COLUMBIA UNIVERSITY IN THE CITY OF NEW YORK, New York, NY (US); Baradwaj Vigraham, San Jose, CA (US); Jayanth Kuppambatti, New York, NY (US); Peter R. Kinget, Summit, NJ (US)

(72) Inventors: Baradwaj Vigraham, San Jose, CA (US); Jayanth Kuppambatti, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/021,620

(22) PCT Filed: Sep. 15, 2014

(86) PCT No.: PCT/US2014/055705
§ 371 (c)(1),
(2) Date: Mar. 11, 2016

(87) PCT Pub. No.: WO2015/039049
PCT Pub. Date: Mar. 19, 2015

(65) Prior Publication Data
US 2016/0226451 A1    Aug. 4, 2016

Related U.S. Application Data

(60) Provisional application No. 61/877,874, filed on Sep. 13, 2013, provisional application No. 61/937,602, (Continued)

(51) Int. Cl.
*H03F 3/38*    (2006.01)
*H03F 1/26*    (2006.01)
(Continued)

(52) U.S. Cl.
CPC ............... *H03F 1/26* (2013.01); *H03F 3/217* (2013.01); *H03F 3/2173* (2013.01);
(Continued)

(58) Field of Classification Search
CPC . H03F 3/38; H03F 3/387; H03F 3/393; H03F 3/40
(Continued)

(56) References Cited

U.S. PATENT DOCUMENTS 3,890,837 A    6/1975 Frizzell et al.
6,515,460 B1    2/2003 Farrenkopf
(Continued)

OTHER PUBLICATIONS

Analog Devices, "Rail-to-Rail I/O Amplifiers", Technical Report, last accessed Jul. 25, 2016, pp. 1-20.
(Continued)

*Primary Examiner* — Steven J Mottola
(74) *Attorney, Agent, or Firm* — Byrne Poh LLP

(57) ABSTRACT

Circuits and methods for switched mode operational amplifiers are provided. In some embodiments, circuits are provided, the circuits comprising: an amplifier having an output; a first pulse width modulator (PWM) having an input coupled to the output of the amplifier and using a first periodic reference signal waveform; and a second PWM having an input coupled to the output of the amplifier and using a second periodic reference signal waveform, wherein the second periodic reference signal waveform is 180 degrees out of phase from the first periodic reference signal waveform. In some embodiments, circuits are provided, the circuits comprising: an amplifier having an output; and a
(Continued)

plurality of pulse width modulators (PWMs) each having an input coupled to the output of the amplifier and using a corresponding unique one of a plurality of periodic reference signal waveforms, wherein the plurality of periodic reference signal waveforms are shifted in phase.

4 Claims, 25 Drawing Sheets

Related U.S. Application Data filed on Feb. 9, 2014, provisional application No. 62/044,830, filed on Sep. 2, 2014.

(51) Int. Cl.
| | |
|---|---|
| H03K 3/017 | (2006.01) |
| H03F 3/217 | (2006.01) |
| H03F 3/45 | (2006.01) |
| H03K 3/037 | (2006.01) |
| H03K 5/24 | (2006.01) |

(52) U.S. Cl.
CPC ......... *H03F 3/45636* (2013.01); *H03K 3/017* (2013.01); *H03K 3/037* (2013.01); *H03K 5/24* (2013.01); *H03F 2200/264* (2013.01); *H03F 2200/351* (2013.01); *H03F 2203/45288* (2013.01)

(58) Field of Classification Search
USPC .............................. 330/10; 332/109; 375/238
See application file for complete search history.

(56) References Cited

U.S. PATENT DOCUMENTS

| | | |
|---|---|---|
| 6,678,178 B2 | 1/2004 | Lipcsei |
| 7,063,103 B2 | 6/2006 | Lind |
| 7,078,964 B2 | 7/2006 | Risbo et al. |
| 7,504,812 B2 | 3/2009 | Riehl |
| 7,589,987 B2 | 9/2009 | Lipcsei |
| 7,969,242 B2 | 6/2011 | Garudadri et al. |
| 8,022,756 B2 | 9/2011 | Walker et al. |
| 8,035,365 B2 | 10/2011 | Kikuchi |
| 8,085,017 B2 | 12/2011 | Qiu et al. |
| 8,289,074 B2 | 10/2012 | Yamamoto et al. |
| 8,553,909 B2 | 10/2013 | Fortier et al. |
| 8,581,763 B2 | 11/2013 | Niwa et al. |
| 8,604,957 B2 | 12/2013 | Pagnanelli et al. |
| 2005/0083115 A1* | 4/2005 | Risbo .................. H03F 3/217 330/10 |
| 2005/0184717 A1 | 8/2005 | Walters |
| 2010/0109621 A1 | 5/2010 | Lee |
| 2011/0101940 A1 | 5/2011 | Kudo |
| 2012/0194245 A1 | 8/2012 | Paillet et al. |

OTHER PUBLICATIONS

Balankutty, A., et al., "A 0.6-V Zero-IF/Low-IF Receiver with Integrated Fractional-N Synthesizer for 2.4-GHz ISM-Band Applications", In IEEE Journal of Solid-State Circuits, vol. 45, No. 3, Mar. 2010, pp. 538-553.
Balankutty, A., et al., "An Ultra-Low Voltage, Low-Noise, High Linearity 900-MHz Receiver With Digitally Calibrated In-Band Feed-Forward Interferer Cancellation in 65-nm CMOS", In IEEE Journal of Solid-State Circuits, vol. 46, No. 10, Aug. 18, 2011, pp. 2268-2283.
Balankutty, A., et al., "Ultra-Low Voltage Integrated Receivers in Nanoscale CMOS", in International Midwest Symposium on Circuits and Systems, in IEEE, Aug. 7-10, 2011, pp. 1-4.
Barr, M., "Pulse Width Modulation", In Embedded Systems Programming, Sep. 2001, pp. 103-104.
Berkhout, M., et al., "Class-D Audio Amplifiers in Mobile Applications", In IEEE Transactions on Circuits and Systems, vol. 57, No. 5, May 2010, pp. 992-1002.
Chatterjee, S., "A 0.5-V 1-Msps Track-and-Hold Circuit With 60-dB SNDR", In IEEE Journal of Solid-State Circuits, vol. 42, Apr. 2007, pp. 722-729.
Chatterjee, S., et al., "A 0.5-V Filter with PLL-Based Tuning in 0.18 μm CMOS", In Proceedings of the IEEE International Solid-State Circuits Conference (ISSCC '05), Digest of Technical Papers, vol. 1, San Francisco, CA, US, Feb. 9, 2005, pp. 506-507, and 613.
Cijvat, E., "CMOS Integrated Switched-Mode Transmitters for Wireless Communication", In Advances in Solid State Circuit Technologies, Apr. 2010, pp. 289-306.
Crepaldi, M., et al., "An Ultra-Wideband Impulse-Radio Transceiver Chipset Using Synchronized-OOK Modulation", In IEEE Journal of Solid-State Circuits, vol. 46, No. 10, Oct. 2011, pp. 2284-2299.
Crols, J., et al., "Switched-Opamp: An Approach to Realize Full CMOS Switched-Capacitor Circuits at Very Low Power Supply Voltages", In IEEE Journal of Solid-State Circuits, vol. 29, No. 8, Aug. 1994, pp. 936-942.
De Matteis, M., et al., "A 0.55 V 60 dB-DR Fourth-Order Analog Baseband Filter", In Journal of Solid State Circuits, vol. 44, No. 9, Sep. 2009, pp. 2525-2534.
Deslauriers, I., et al., "Naturally Sampled Triangle Carrier PWM Bandwidth Limit and Output Spectrum," In IEEE Transactions on Power Electronics, vol. 20, No. 1, Jan. 2005, pp. 100-106.
Drost, B., et al., "A 0.55V 61dB-SNR 67dB-SFDR 7MHz 4th-Order Butterworth Filter Using Ring-Oscillator-Based Integrators in 90nm CMOS", In Proceedings of the International Solid State Circuit Conference, Feb. 19-23, 2012, pp. 360-362.
Drost, B., et al., "Analog Filter Design Using Ring Oscillator Integrators", In IEEE Journal of Solid State Circuits, Dec. 21, 2012, pp. 3120-3129.
Gilbert, B., "Current Mode, Voltage Mode, or Free Mode? A Few Sage Suggestions", In Analog Integrated Circuits and Signal Processing, vol. 38, No. 2, Feb. 2004, pp. 83-101.
Gilbert, B., "Current-Mode Circuits from a Translinear Viewpoint: A Tutorial", In Analogue IC Design: the Current-Mode Approach, The Institution of Engineering and Technology, Ch. 2, Jan. 1993, pp. 11-91.
Gorlatova, M., et al., "Demo: Prototyping Energy Harvesting Active Networked Tags (En-HANTs) with MICA2 Motes", In 7th Annual IEEE Communications Society Conference on Sensor, Mesh and Ad Hoc Communications and Networks (SECON), Jun. 21-25, 2010, pp. 1-3.
Gorlatova, M., et al., "Energy Harvesting Active Networked Tags (EnHANTs) for Ubiquitous Object Networking", In IEEE Wireless Communications, vol. 17, No. 6, Dec. 2010, pp. 18-25.
Gubbins, D., et al., "Continuous-Time Input Pipeline ADCs", In IEEE Journal of Solid-State Circuits, vol. 45, No. 8, Aug. 2010, pp. 1456-1468.
Hamman, J., et al., "Voltage Harmonics Generated by Voltage-Fed Inverters Using PWM Natural Sampling", In IEEE Transactions on Power Electronics, vol. 3, No. 3, Jul. 1988, pp. 297-302.
IMEC International, "Ultra-Low Power 1 GBPS ADC", Technical Report, Feb. 2014, pp. 1-3.
Iwata, A., et al., "A Concept of Analog-Digital Merged Circuit Architecture for Future VLSI's", In The Institute of Electronics, Information, and Communication Engineers Transactions on Fundamentals of Electronics, Communications and Computer Sciences, vol. 79, No. 2, Feb. 25, 1996, pp. 145-157.
Kinget, P., "Designing Analog and RF Circuits for Ultra-Low Supply Voltages", In 37th European Solid State Device Research Conference, Sep. 11-13, 2007, pp. 58-67.
Kurchuk, M., et al., "Event-Driven GHz-Range Continuous-Time Digital Signal Processor With Activity-Dependent Power Dissipation", In IEEE Journal of Solid-State Circuits, vol. 47, No. 9, Sep. 2012. pp. 2164-2173.
Kurchuk, M., et al., "Energy-Efficient Asynchronous Delay Element with Wide Controllability", In Proceedings of IEEE International Symposium on Circuits and Systems, May 30-Jun. 2, 2010, pp. 3837-3840.

(56) References Cited

OTHER PUBLICATIONS

Lewyn, L., et al., "Analog Circuit Design in Nanoscale CMOS Technologies", In Proceedings of the IEEE, vol. 97, No. 10, Oct. 2009, pp. 1687-1714.
Li, Y., et al.,"A Continuous-Time Programmable Digital FIR Filter", In IEEE Journal of Solid-State Circuits, vol. 41, No. 11, Nov. 2006, pp. 2512-2520.
Nagata, M., et al.,"A PWM Signal Processing Core Circuit Based on a Switched Current Integration Technique", In IEEE Journal of Solid-State Circuits, vol. 33, No. 1, Jan. 1996, pp. 53-60.
Nielsen, M., et al., "A Transmitter Architecture Based on Delta-Sigma Modulation and Switch-Mode Power Amplification", In IEEE Circuits and Systems II, Aug. 2007, pp. 735-739.
Park, M., et al., "A 78 dB SNDR 87 mW 20 MHz Bandwidth Continuous-Time ADC With VCO-Based Integrator and Quantizer Implemented in 0.13 µmCMOS", In IEEE Journal of Solid-State Circuits, vol. 44, No. 12, Dec. 2009, pp. 3344-3358.
Pavan, S., "Excess Loop Delay Compensation in Continuous-Time Delta-Sigma Modulators", In IEEE Transactions on Circuits and Systemes II: Express Briefs, vol. 55, No. 11, Nov. 2008, pp. 1119-1123.
Pun, K., et al., "A 0.5-V 74-dB SNDR 25-kHz Continuous-Time Delta-Sigma Modulator With a Return-to-Open DAC", In IEEE Journal of Solid-State Circuits, vol. 42, No. 3, Feb. 26, 2007. pp. 496-507.
Rehman, S., "Delta Sigma Based Switched Mod On-Chip FM Transmitter Architecture", In the International Journal for Electro Computational World Knowledge, Apr. 2012, pp. 20-27.
Schell, B., et al., "A Continuous-Time ADC/DSP/DAC System With No Clock and With Activity-Dependent Power Dissipation", In IEEE Journal of Solid-State Circuits, vol. 43, No. 11, Nov. 2008, pp. 2472-2481.
Schell, B., et al., "A Low Power Tunable Delay Element Suitable for Asynchronous Delays of Burst Information", In IEEE Journal of Solid-State Circuits, vol. 43, No. 5, May 2008, pp. 1227-1234.
Shen, J., et al., "A 0.5-V 8-Bit 10-Ms/s Pipelined ADC in 90-nm CMOS", In IEEE Journal of Solid-State Circuits, vol. 43, Apr. 2008, pp. 787-795.
Shettigar, P., et al., "A 15mW 3.6 GS/s CT-ADC with 36MHz bandwidth and 83dB DR in 90nm CMOS", In Solid-State Circuits Conference Digest of Technical Papers (ISSCC), Feb. 19-23, 2012, pp. 156-158.
Shu, W., et al., "IMD of Closed-Loop Filterless Class D Amplifiers", In IEEE Transactions on Circuits and Systems I: Regular Papers, Feb. 2010, pp. 518-527.
Singh, V., et al., "A 16MHz BW 75dB DR CT Delta Sigma ADC Compensated for More than One Cycle Excess Loop Delay", In 2011 IEEE Custom Integrated Circuits Conference (CICC), Sep. 19-21, 2011, pp. 1-4.
Singh, V., et al., "Compensating for Quantizer Delay in Excess of One Clock Cycle in Continuous-Time Modulators", In IEEE Transactions on Circuits and Systems II: Express Briefs, vol. 57, No. 9, Sep. 2010, pp. 676-680.
Stanic, N., et al., "A 2.4-GHz ISM-Band Sliding-IF Receiver With a 0.5-V Supply", In IEEE Journal of Solid-State Circuits, vol. 43, No. 5, May 2008, pp. 1138-1145.
Stanje, G., et al., "Demo: Organic Solar Cell-Equipped Energy Harvesting Active Networked Tag (EnHANTs) Prototypes", In Proceedings of the 9th ACM Conference on Embedded Networked Sensor Systems, Nov. 2011, pp. 385-386.
Straayer, M., et al., "A 12-Bit, 10-MHz Bandwidth, Continuous-Time ADC With a 5-Bit, 950-MS/s VCO-Based Quantizer", In IEEE Journal of Solid-State Circuits, vol. 43, No. 4, Apr. 2008. pp. 805-814.
Tsividis, Y., "Event-Driven Data Acquisition and Digital Signal Processing; A Tutorial", In IEEE Transactions on Circuits and Systems II, vol. 57, No. 8, Aug. 2010, pp. 577-581.
Tsividis, Y., "Continuous-Time Digital Signal Processing", In Electronics Letters, vol. 39, No. 21, Oct. 16, 2003, pp. 1551-1552.
Tsividis, Y., "Digital Signal Processing in Continuous Time: a Possibility for Avoiding Aliasing and Reducing Quantization Error", In Proceedings of IEEE International Conference of Acoustics, Speech, and Signal Processing (ICASSP '04), vol. 2, May 17-21, 2004, pp. 589-592.
Vigraham, B., et al., "An Ultra Low Power, Compact UWB Receiver with Automatic Threshold Recovery in 65 nm CMOS", In Proceedings of the IEEE Radio Frequency Integrated Circuits Symposium, Montreal, QC, CA, Jun. 17-18, 2012, pp. 251-254.
Vittoz, E.A., "Future of Analog in the VLSI Environment", In Proceedings of the IEEE International Symposium on Circuits and Systems (ISCAS '90), vol. 2, New Orleans, LA, US, May 1-3, 1990, pp. 1372-1375.
Yu, S., et al., "A 0.65-V 2.5-GHz Fractional-N Synthesizer With Two-Point 2-Mb/s GFSK Data Modulation", In IEEE Journal of Solid-State Circuits, vol. 44, Sep. 2009, pp. 2411-2425.
Zhou, B., "A Low-Noise Delta-Sigma Phase Modulator for Polar Transmitters", In The Scientific World Journal, Feb. 2014, pp. 1-9.
Zhu, J., et al., "Demo: Prototyping UWB-Enabled En-HANTs", In Proceedings of the 9th International Conference on Mobile Systems, Applications, and Services (ACM MobiSys'11) Jun. 28-Jul. 1, 2011, pp. 387-339.
Extended European Search Report dated Mar. 13, 2017 in European Patent Application No. 14844394.8.
Office Action dated Mar. 6, 2018 in CN Patent Application No. 201480061850.0.
Office Action dated Mar. 19, 2018 in EP Patent Application No. 14844394.8.

\* cited by examiner

CIRCUITS AND METHODS FOR SWITCHED-MODE OPERATIONAL AMPLIFIERS

CROSS REFERENCE TO RELATED APPLICATIONS

This application claims the benefit of U.S. Provisional Patent Application No. 61/877,874, filed Sep. 13, 2013, U.S. Provisional Patent Application No. 61/937,602, filed Feb. 9, 2014, and U.S. Provisional Patent Application No. 62/044,830, filed Sep. 2, 2014, each of which is hereby incorporated by reference herein in its entirety.

STATEMENT REGARDING GOVERNMENT FUNDED RESEARCH

This invention was made with government support under grants 0964497 and 1067934 awarded by the National Science Foundation. The government has certain rights in the invention.

BACKGROUND

All signals in the physical world are analog. Music, speech, images, movies, as well as wireless, fiber optic or wireline communication signals are continuous-time continuous-value signals. The core of the majority of electronic appliances use digital signal processing and memories, representing information with time and amplitude quantized signals. The analog-to-digital and digital-to-analog interfaces are crucial to reap the benefits of increasingly better digital signal processing. The number of analog-to-digital and digital-to-analog interfaces and their quality requirements has been increasing as semiconductor technology scaling has made the integration of whole electronic systems on a single chip possible.

Even though highly scaled CMOS technologies offer tremendous digital signal processing density and speed increases, the design of analog-to-digital and digital-to-analog interfaces becomes progressively harder with every new technology node. Although scaled technologies have resulted in higher clock frequencies, other analog characteristics of devices, such as DC gain and matching, have been deteriorating, and supply voltages have been shrinking substantially.

The progressive downscaling of the supply voltage as CMOS technologies scale is very challenging for analog circuits since reducing the supply voltage, reduces the maximum signal value and thus puts more demands on reducing noise or interference to maintain the same signal-to-noise ratio or dynamic range.

Accordingly, new circuits that can operate at lower supply voltages are desirable.

SUMMARY

Circuits and methods for switched mode operational amplifiers are provided. In some embodiments, circuits are provided, the circuits comprising: an amplifier having an output; a first pulse width modulator (PWM) having an input coupled to the output of the amplifier and using a first periodic reference signal waveform; and a second PWM having an input coupled to the output of the amplifier and using a second periodic reference signal waveform, wherein the second periodic reference signal waveform is 180 degrees out of phase from the first periodic reference signal waveform. In some embodiments, circuits are provided, the circuits comprising: an amplifier having an output; and a plurality of pulse width modulators (PWMs) each having an input coupled to the output of the amplifier and using a corresponding unique one of a plurality of periodic reference signal waveforms, wherein the plurality of periodic reference signal waveforms are shifted in phase.

DETAILED DESCRIPTION

Circuits and methods for switched mode operational amplifiers are provided. Switched mode operation amplifiers operate in a switched-mode analog domain. In this domain, signal information is encoded in continuously varying, un-quantized pulse widths of one or more switching rail-to-rail (or nearly rail-to-rail) signals.

Figure 1:
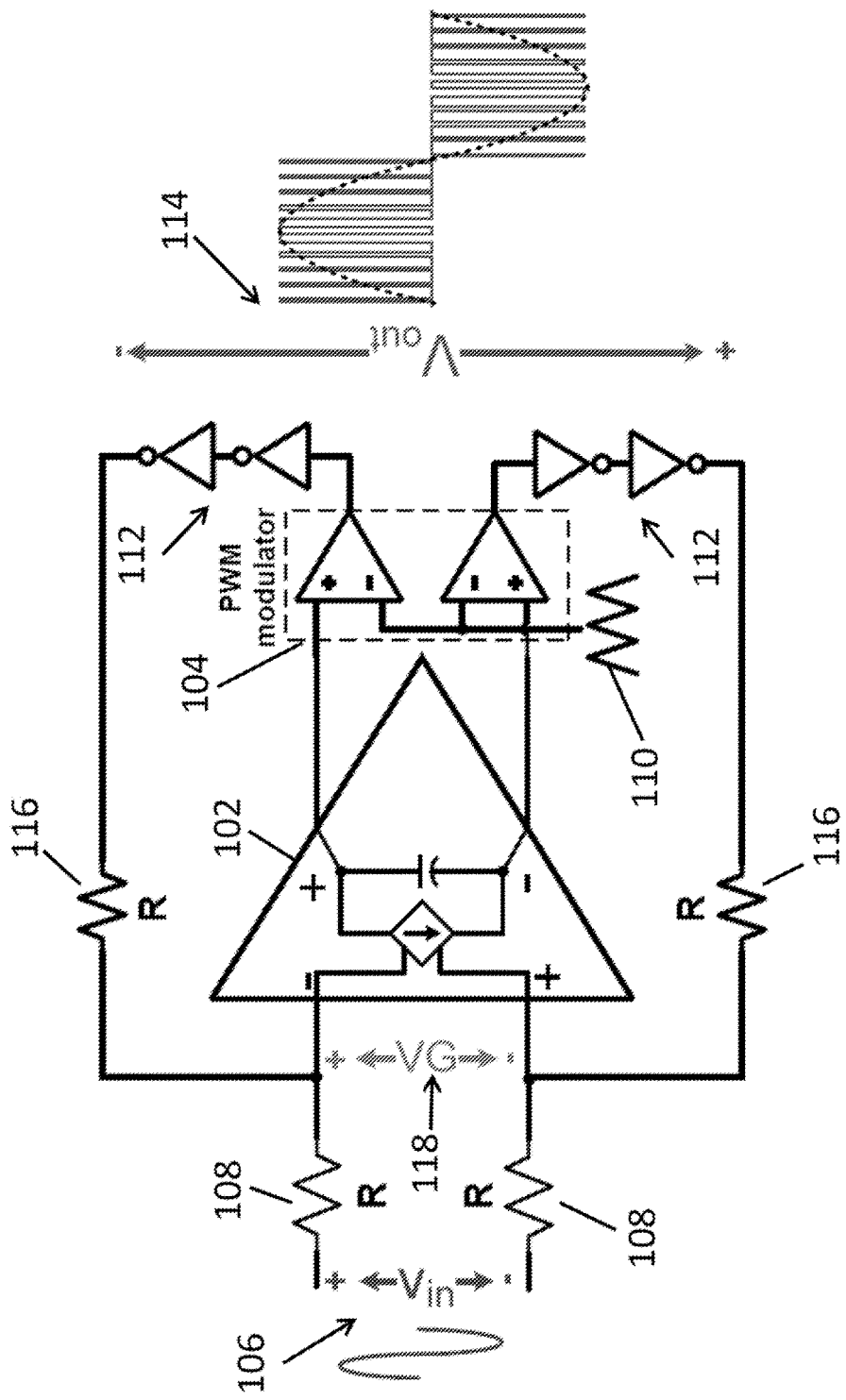
FIG. 1 illustrates an example of a Switched-Mode Operational Amplifier (SMOA) in accordance with some embodiments.

FIG. 1 illustrates an example 100 of a Switched-Mode Operational Amplifier (SMOA) configured as a resistive feedback amplifier in accordance with some embodiments. In some embodiments, the input and feedback resistors can be replaced by passive components like resistors, capacitors or inductors. The feedback resistors in a SMOA can also be replaced by active blocks (e.g., like delay cells) to implement area-efficient capacitors. As shown, SMOA 100 includes a transconductor $G_{m1s}$ 102 and a Pulse Width Modulator (PWM) 104. The transconductor amplifies an input signal $V_{in+}$, $V_{in-}$ 106 received via input resistors 108 and the PWM converts the signal information in the amplified signal from the voltage domain to pulses with varying widths based on a comparison of those signals to a reference waveform 110. The pulses of varying widths are provided by PWM 104 to inverters 112, which drive outputs at $V_{out+}$, $V_{out-}$ 114 and drive feedback resistors 116 to provide a feedback to a virtual ground at $VG_+$, $VG_-$ 118.

Although various embodiments are described herein using continuous time pulse width modulation, any other suitable time encoding scheme can be used in some embodiments. For example, in some embodiments, sample pulse width modulation can be used. As another example, in some embodiments, pulse position modulation can be used.

As illustrated in FIG. 1, the reference waveform can be a triangular waveform in some embodiments. Any other suitable references waveform (such as a saw tooth waveform) can be used in some embodiments.

Although the SMOA illustrated in FIG. 1 is shown as a differential SMOA, it should be understood that this circuit can be implemented as a single-ended SMOA in accordance with some embodiments. Likewise, unless otherwise specified, for each circuit described herein as a differential circuit or single-ended circuit, an alternate circuit can be implemented as a single-ended circuit or a differential circuit, respectively, in accordance with some embodiments.

Figure 2:
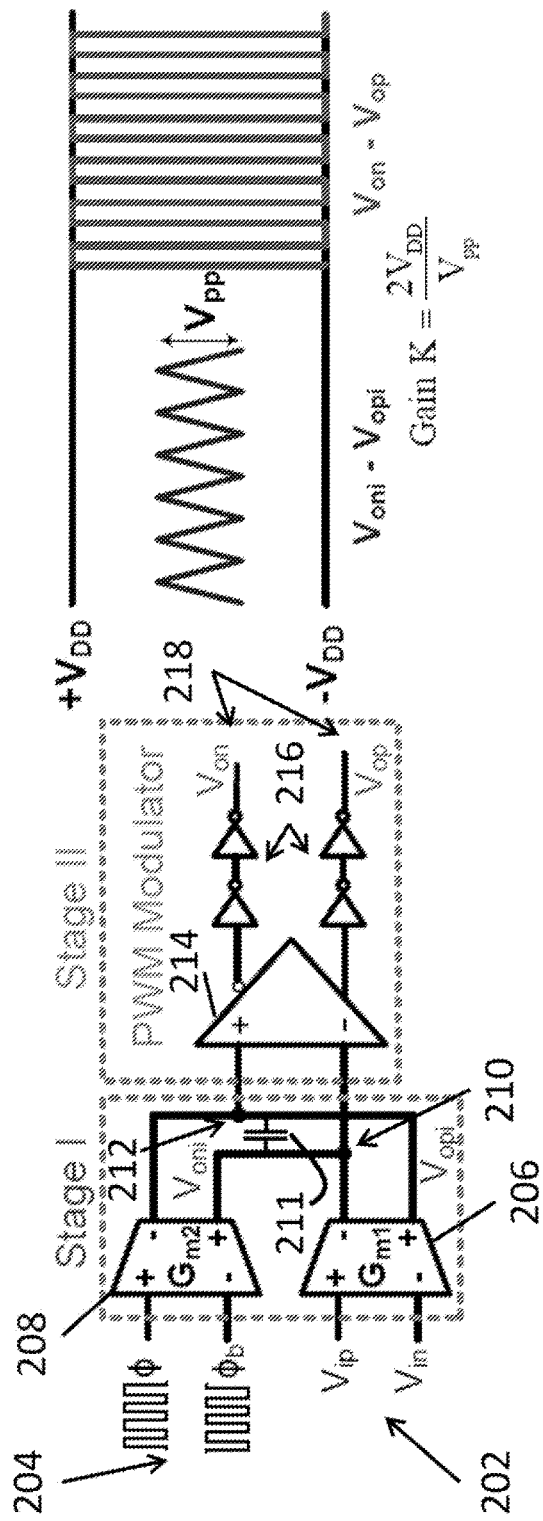
FIG. 2 illustrates an example of a simplified diagram of a two-stage SMOA in accordance with some embodiments.

Turning to FIG. 2, an example 200 of a simplified diagram of a two-stage Switched-Mode Operational Amplifier (SMOA) in accordance with some embodiments is shown.

During operation, in a first stage, input signal $V_{ip}$, $V_{in}$ 202 and PWM clock signal $\phi$, $\phi_b$ 204 are converted to the current domain by transconductors $G_{m1}$ 206 and $G_{m2}$ 208, respectively, and summed at the nodes $V_{opi}$ 210 and $V_{oni}$ 212 across capacitance 211 (which can be implemented as any suitable capacitance, such as an actual capacitor or parasitic capacitance). In a second stage, a pulse width modulator 214 converts the analog signals $V_{opi}$ and $V_{oni}$ into switched-mode signals in which signal information is represented in pulse widths. These switched mode signals are then buffered by inverters 216 to produce output signals $V_{opi}$ and $V_{on}$ 218.

If K is the gain of the second stage, then the swing of the desired signal component at node $V_{opi}$ 210 and $V_{oni}$ 212 is related to output signals $V_{op}$ and $V_{on}$ 218 by $V_{opi}-V_{oni}=K(V_{op}-V_{on})$. The total voltage swing at nodes $V_{opi}$ and $V_{oni}$ is the sum of the signal component and the PWM reference signal. If the second stage has no gain (i.e., K=1), then if the output swings rail-to-rail, so will the nodes $V_{opi}$ and $V_{oni}$, which dramatically increases the distortion contribution of transconductors $G_{m1}$ 206 and $G_{m2}$ 208. By controlling the peak-to-peak amplitude $V_{pp}$ of the PWM reference ramp signal on nodes $V_{opi}$ 210 and $V_{oni}$ 212, it can be shown that the gain of the second stage is given by $K=(V_{op}-V_{on})/(V_{opi}-V_{oni})=2V_{DD}/V_{pp}$, where $V_{DD}$ is the supply voltage. As a result, the signal swing at the nodes $V_{opi}$ and $V_{oni}$ is only a fraction of the output swing.

Figure 3:
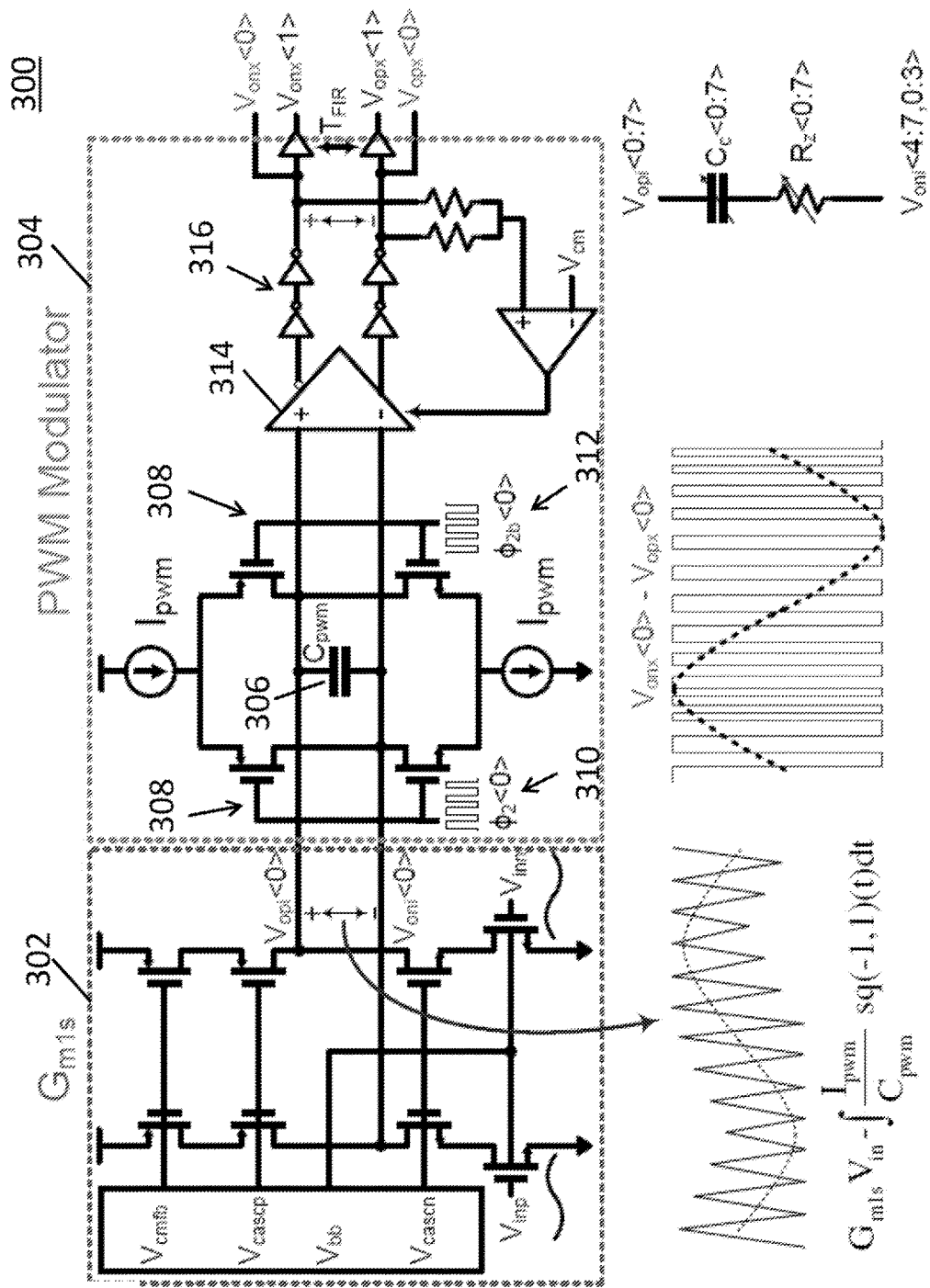
FIG. 3 illustrates a detailed schematic of a SMOA in accordance with some embodiments.
Figure 4:
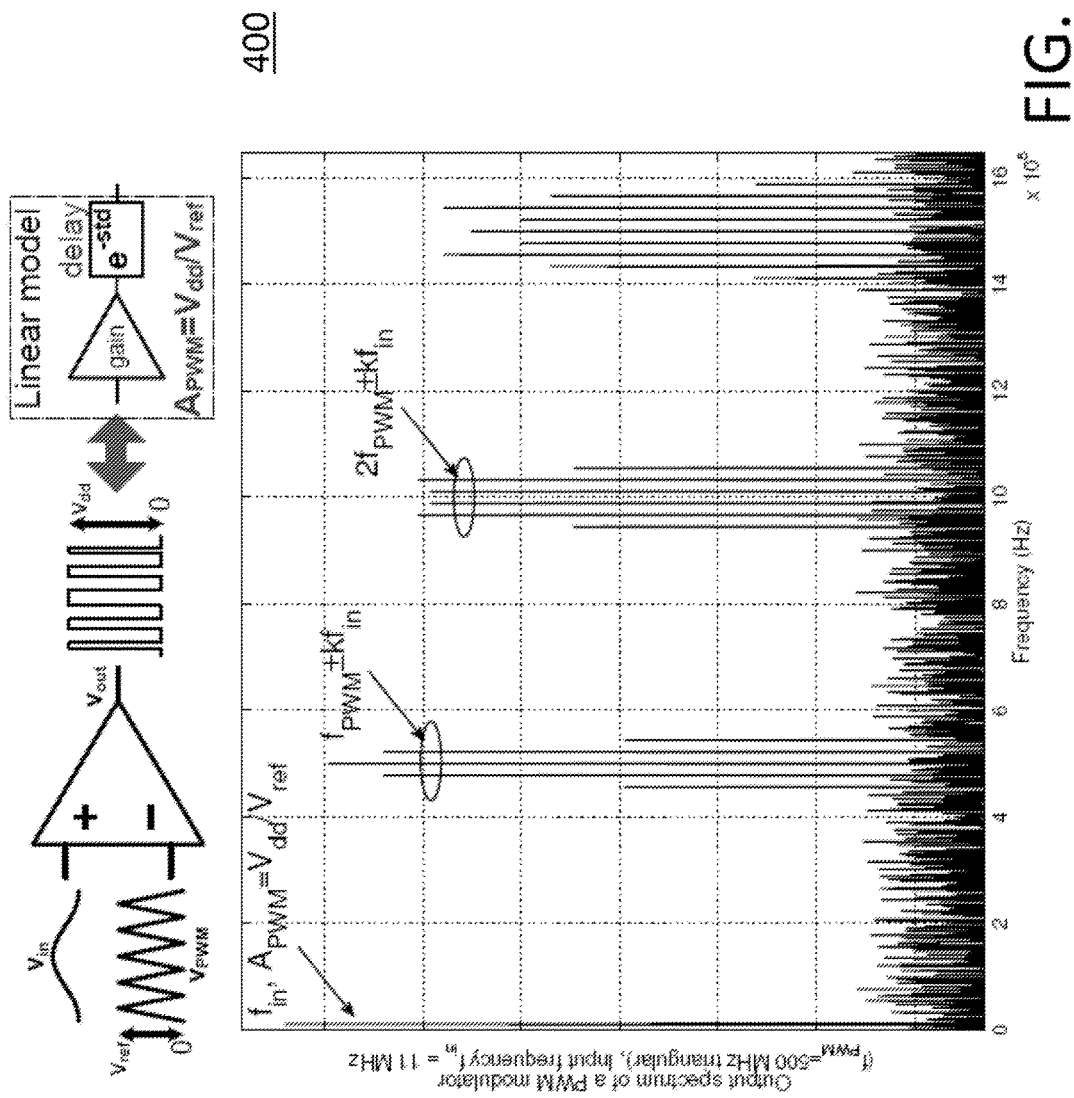
FIG. 4 illustrates an example of the output spectrum of a continuous pulse width modulator in accordance with some embodiments.

FIG. 3 shows an example 300 of an implementation of a SMOA in accordance with some embodiments. As illustrated, SMOA 300 includes a transconductor $G_{m1s}$ 302 and a pulse width modulator (PWM) 304. In the embodiment shown, transconductor $G_{m1s}$ 302 is implemented as a pseudo-differential telescopic cascode amplifier whose bias current is controlled by body-mirroring. The PWM reference signal is generated by charging and discharging a capacitor $C_{PWM}$ 306, connected to the output of $G_{m1s}$ 302, using a current steering differential pair 308 under the control of square waves $\phi_2$ 310 and $\phi_{2b}$ 312, which are 180 degrees out of phase. The output signal current of $G_{m1s}$ is also steered to capacitor $C_{PWM}$ 306. In the embodiment shown, the pulse width modulator includes a continuous-time comparator 314, which can be implemented as a cascade of three differential pairs in some embodiments, and is followed by inverter based gain stages 316, which slice the output of the comparator to obtain the pulse width modulated representation of the transconductor's output Turning to FIG. 4, an example 400 of the output spectrum of a continuous pulse width modulator in accordance with some embodiments is shown. As illustrated, the output spectrum has the following characteristics: (1) a tone at the fundamental, $f_{in}$, with a gain $A_{PWM}=V_{dd}/V_{ref}$; and (2) modulation components around the carrier frequency $f_{PWM}\pm kf_{in}$ and its harmonics $nf_{PWM}\pm kf_{in}$. The phase behavior of the fundamental component can be modeled as a continuous time delay $e^{-st_d}$ due to the propagation delay ($t_d$) in the PWM.

In a fully differential implementation, for a triangular wave modulated PWM signal, the first modulation components occur around $2f_{PWM}$ compared to $f_{PWM}$ in a single-ended case.

The limits on the maximum representable signal at the output of the SMOA is readily seen to be $V_{dd}(1-2t_{min}f_{PWM})$, where $t_{min}$ represents the smallest digital pulse that can be comfortably represented and is limited by the technology in which the circuit is implemented. For example, in a 65 nm CMOS technology, $t_{min}$ approaches 100 ps and a 500 MHz modulation frequency allows for a maximum peak-to-peak signal swing of $0.9V_{dd}$.

In some embodiments, a higher $f_{PWM}$ can be used to move the modulation components away from the input signal frequency, but the maximum representable signal ($V_{dd}(1-2t_{min}f_{PWM})$) will be reduced as a result of such a higher $f_{PWM}$ since $t_{min}$ is technology limited.

In some embodiments, to reduce the impact of the modulation components, multiple PWMs, each with a reference waveform having a frequency $f_{PWM}$ but being equally shifted in phase from the reference waveform of the other of the PWMs and each having an input coupled to the same output of the SMOA transconductor, can be provided as the second stage of the SMOA and the outputs of the PWMs can be summed via equally sized resistors.

Figure 5:
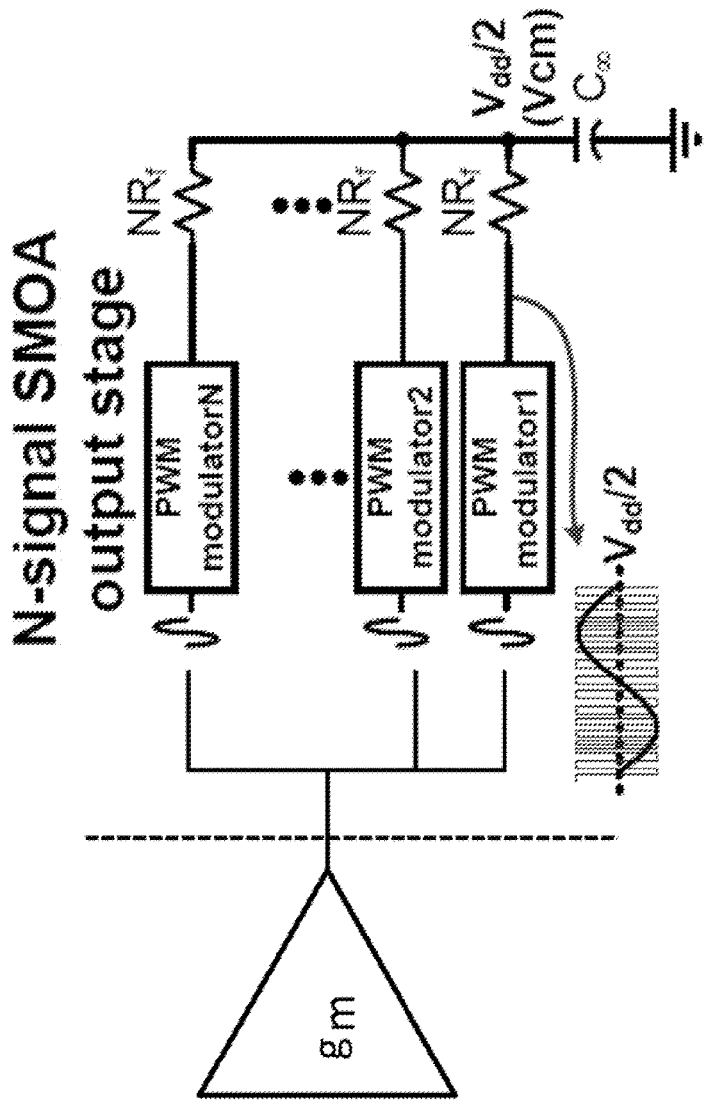
FIG. 5 illustrates an example of a multi-phase pulse width modulator (PWM) output stage of a SMOA in accordance with some embodiments.

An example 500 of such a configuration is illustrated in FIG. 5. This configuration will cancel modulation components around successive multiples of the modulation frequency of the reference signal.

An N-phase PWM produces N+1 signal levels. Increasing the number of levels on the output waveform reduces amplitudes of jumps on the virtual ground node, thus reducing linearity requirements for the first stage of the SMOA.

So, for example, a four phase set of PWMs will have reference signals phase shifted by 0, 90, 180, and 270 degrees, and will have modulation spurs around multiples of $4f_{PWM}$ and five signal levels. Likewise, as another example, an eight phase set of PWMs will have reference signals phase shifted by 0, 45, 90, 135, 180, 225, 270, and 315 degrees, and will have modulation spurs around multiples of $8f_{PWM}$ and nine signal levels.

Figure 19:
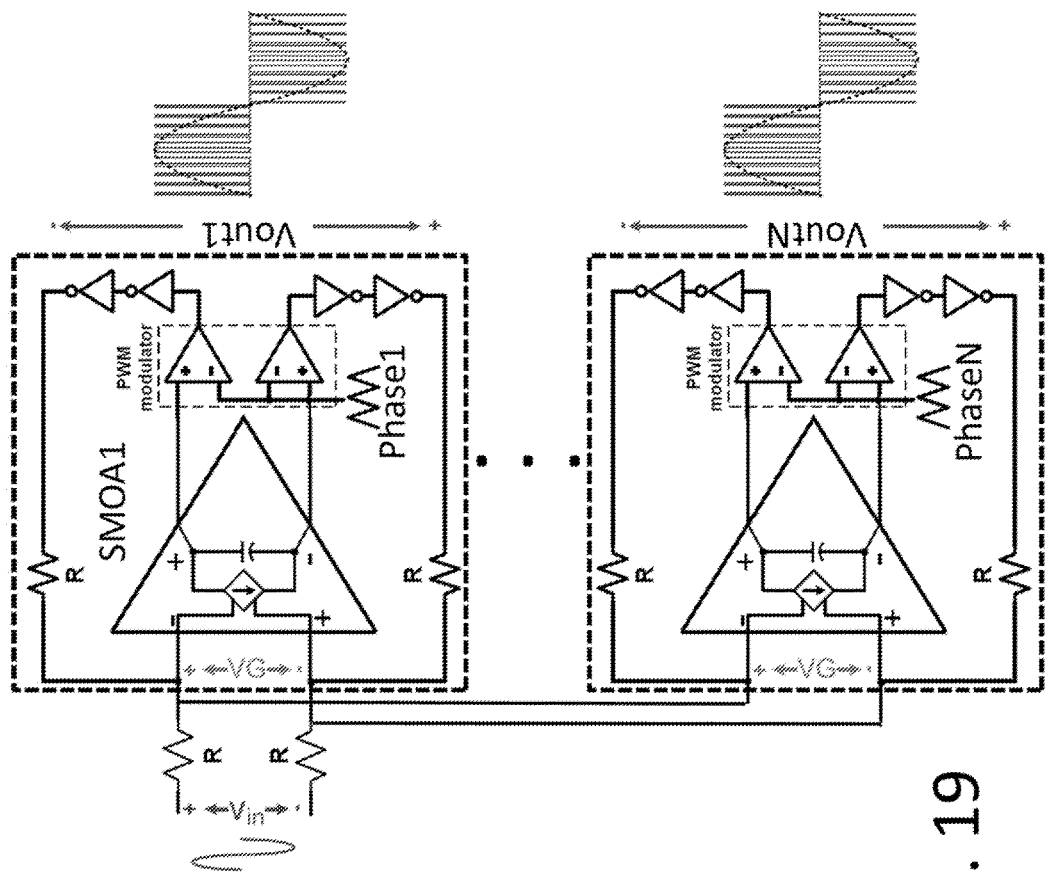
FIG. 19 illustrates an example of a multi-phase SMOA in accordance with some embodiments.

FIG. 19 shows an alternate embodiment of a multi-phase SMOA in accordance with some embodiments. As shown, rather than having a single transconductor in a first stage of a SMOA and multiple PWMs in a second stage, the embodiment of FIG. 19 includes multiple SMOAs connected in parallel and each having a PWM operating at a different phase shift of the PWM reference waveform.

In some embodiments, continuous time finite impulse response (FIR) filtering at the output of the SMOA can be used to reduce modulation components produced at multiples of the PWM clock frequency. In some embodiments, such FIR filtering can be used with a multi-phase PWM SMOA to further reduce the modulation components already reduce by the multi-phase PWM.

In accordance with some embodiments, FIR filtering can be performed by using continuous-time delay cells whose delays are tuned to place a notch at a desired frequency or desired frequencies. For example, to put a notch at 400 MHz, the continuous-time delays cells can be tuned to provide a delay of 1.25 ns. In some embodiments, the FIR delays can be tuned to place notches at any frequency, or at multiple frequencies or bands of frequencies.

Figure 6:
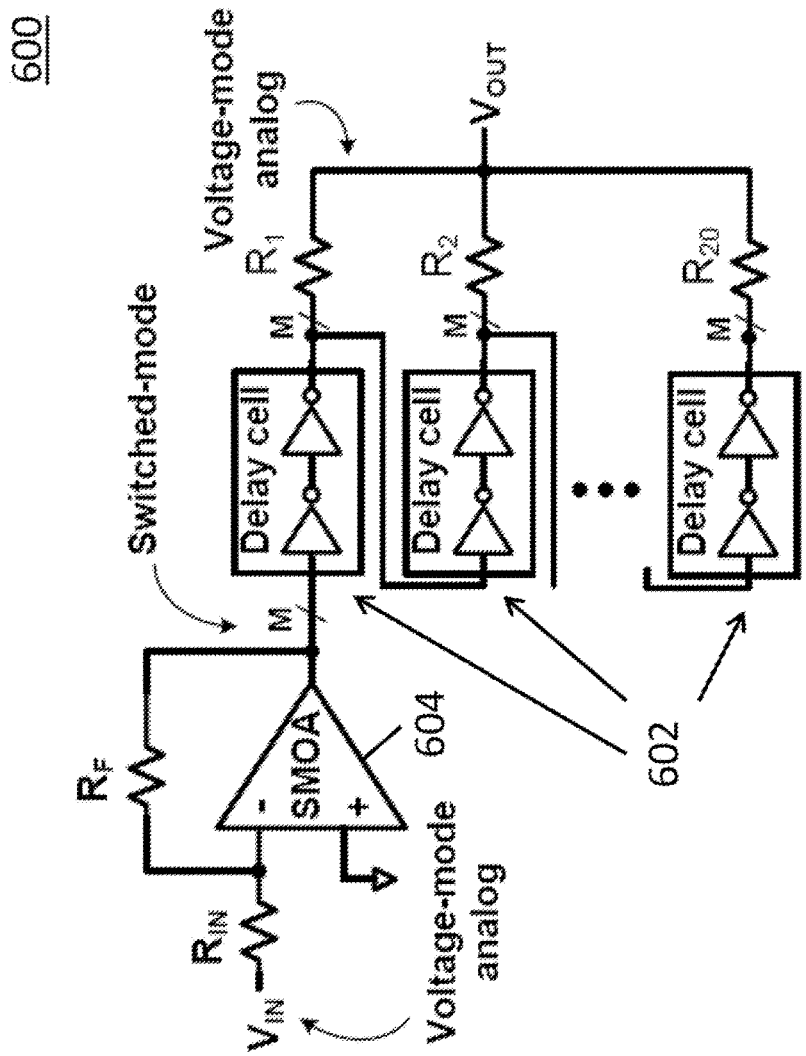
FIG. 6 illustrates an example of a circuit incorporating delay cells at the output of an M-phase SMOA to implement a finite impulse response (FIR) filter in accordance with some embodiments.

FIG. 6 illustrates an example 600 of a circuit incorporating delay cells 602 at the output of an M-phase SMOA 604 to implement a FIR filter in accordance with some embodiments. Any suitable delay cells 602 can be used, and these delay cells can be implemented in any suitable manner. For example, M delay cells can be provided and the delay cells can be implemented using 2N inverters in series.

Figure 7:
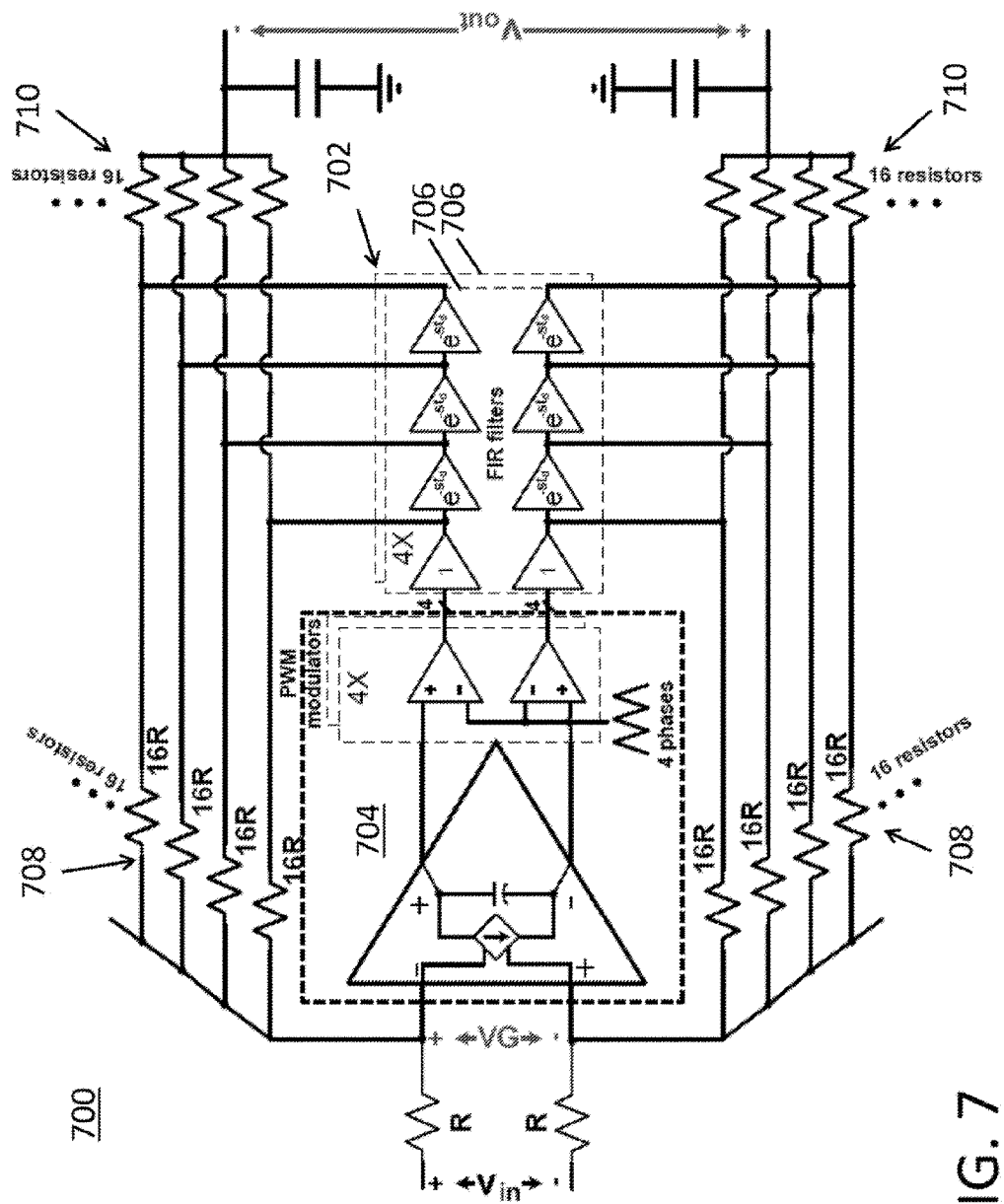
FIG. 7 illustrates an example of a circuit incorporating delay cells at the output of a four-phase SMOA to implement a FIR filter in accordance with some embodiments.

Another example 700 of a circuit incorporating delay cells 702 at the output of a four-phase SMOA 704 is shown in FIG. 7. As illustrated, for each of the four PWM phases, there is a FIR filter bank 706 including an un-delayed output and three delayed outputs. These four outputs across the four banks 706 result in 16 FIR outputs that are used to drive 16 feedback resistors 708 and 16 output resistors 710 for each of the positive and negative legs of the differential device.

Figure 8:
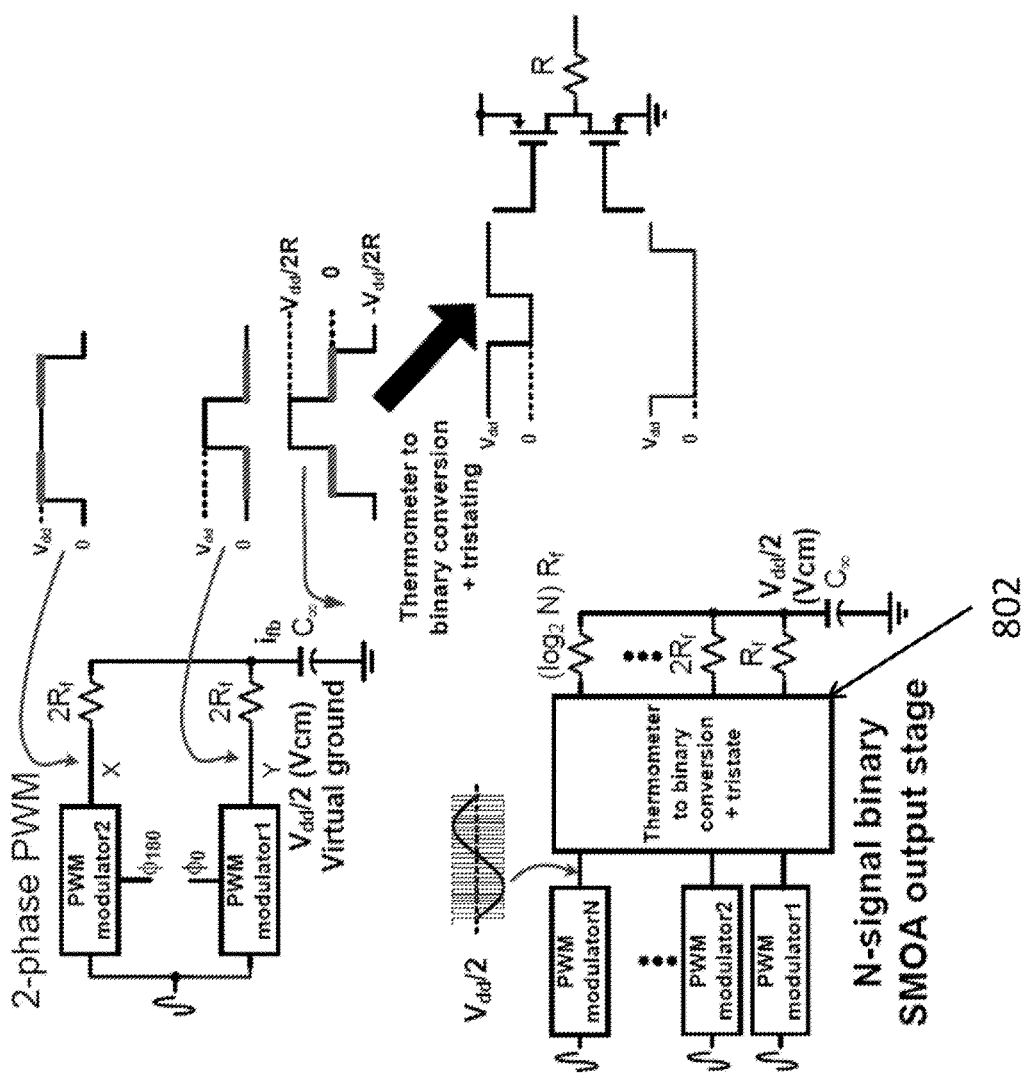
FIG. 8 illustrates a three-level signal representation of an output of multiple parallel PWMs and the use of tristating and a conversion from thermometer coding to binary coding in accordance with some embodiments.

When using a two-phase PWM to drive a single output via output resistors, a three-level signal representation of the output corresponding to feedback currents of $-V_{dd}/2R_f$, 0, $+V_{dd}/2R_f$ may be realized as shown in FIG. 8. The zero current mode, as shown in the FIG. 8, occurs when the current from one modulator output is shunted to ground by the other modulator output.

In some embodiments, to avoid the zero current mode, the output of one of the modulators can be tristated (or floated) when desired.

For a generic multi-phase PWM modulator, a thermometer coding to binary coding conversion in addition to tristating of the modulator outputs can be performed in order to avoid the zero current mode as shown in FIG. 8 in accordance with some embodiments. This can be achieved by adding digital logic 802 between the output of the modulators and the output resistors to convert the thermometer coded signals to binary coded signals.

In some embodiments, SMOAs can be used to implement integrators. For example, as shown in FIGS. 9A and 9B, a SMOA can be used to implement an integrator 900 using delays and resistors in feedback.

Figure 9A:
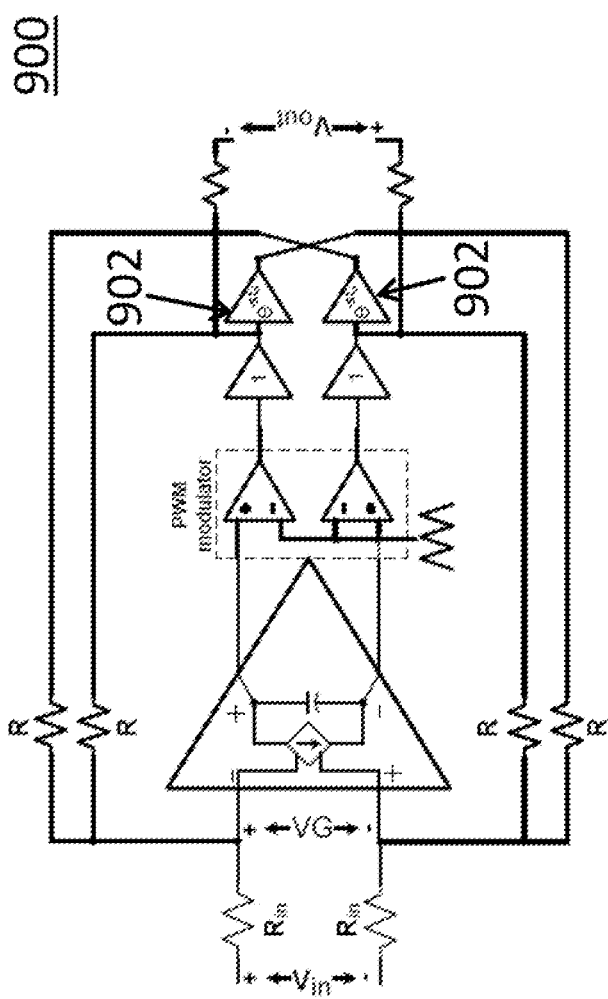
FIGS. 9A and 9B illustrate examples of integrators using delays and resistors in feedback in accordance with some embodiments.

More particularly, as shown in the example of FIG. 9A, a continuous time delay 902 can be used to realize the equivalent of a capacitor in feedback of a traditional active-RC integrator. The capacitor ($C \approx t_d/R$) can be approximated by the current domain subtraction of a delayed and un-delayed signal (($1-e^{-st_d})/R$). The transfer function in the integrator of FIG. 9A is $V_{out}/V_{in} = R/(R_{in}(1-e^{-st_d}))$.

Figure 9B:
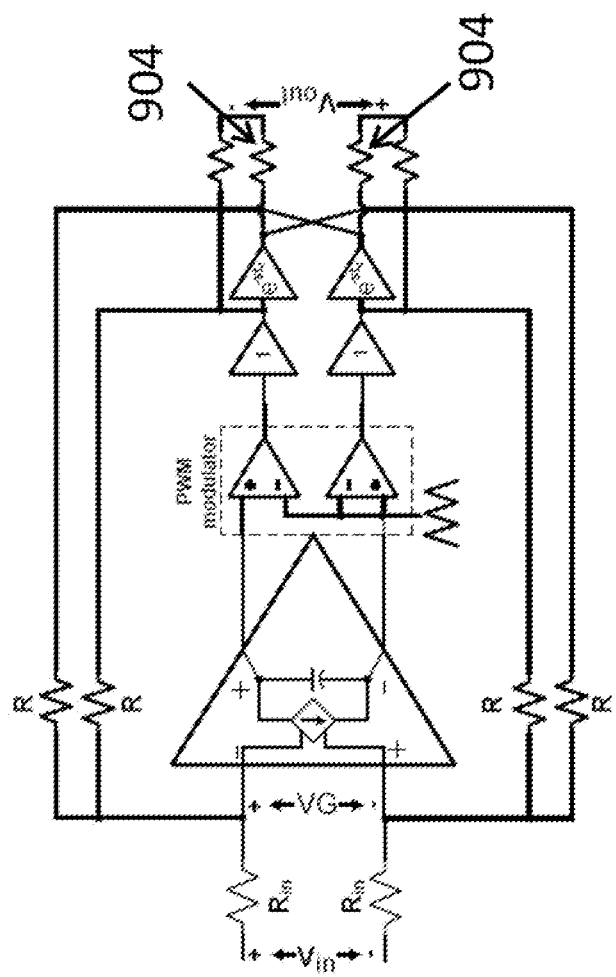

In some embodiments, as shown in FIG. 9B, an integrator can be implemented to realize the transfer function $V_{out}/V_{in} = R(1+e^{-st_d})/(2R_{in}(1-e^{-st_d}))$ (which approximates $R/sR_{in}t_d$ at low frequencies). This enables the realization of a purely reactive transfer function and eliminates the real part of the transfer function introduced by the exponential at specific frequencies. The implementation is achieved by connecting the summing resistors between the differential CMOS output of the SMOA as shown in FIG. 9B.

Although FIGS. 9A and 9B are illustrated using a single phase PWM, these circuits can be implemented using multi-phase PWMs similarly to the manner in which multi-phase PWMS are implemented in FIG. 7. For example, for each PWM output, the delays and resistors can be connected as shown in FIGS. 9A and 9B, and the components for one phases output can only be connected to components of other phases outputs at either the corresponding virtual ground or the corresponding $V_{out}$ terminal.

Figure 10A:
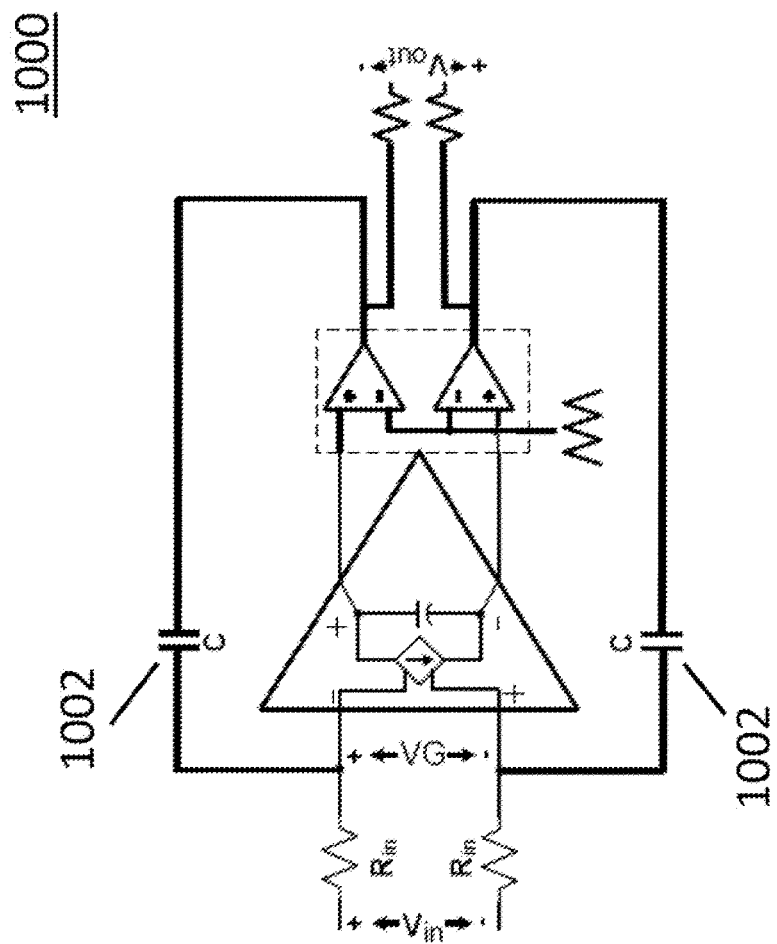
FIGS. 10A and 10B illustrate examples of integrators using capacitive feedback in accordance with some embodiments.
Figure 10B:
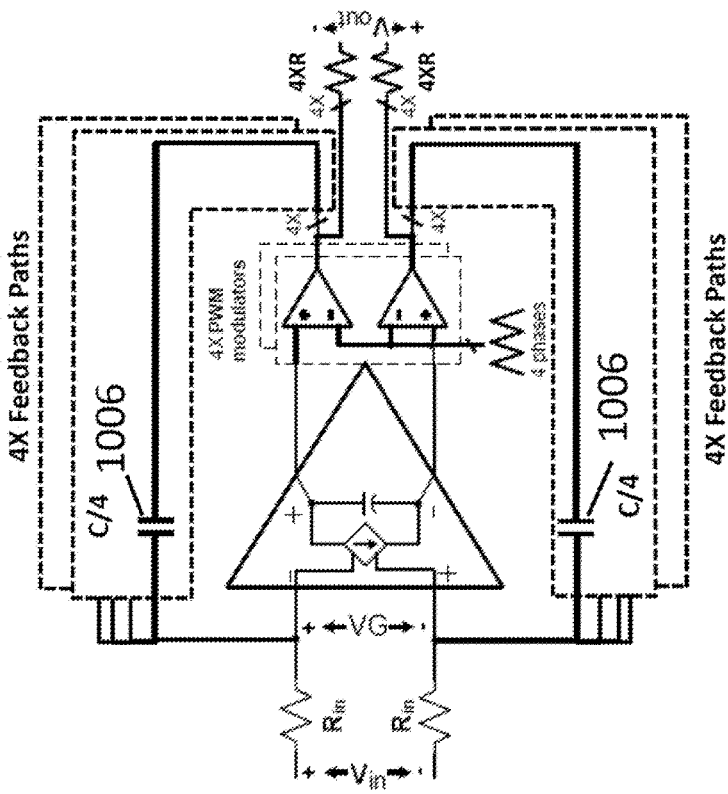

As another example, as shown in FIGS. 10A and 10B, single phase and multi-phase SMOAs can be used to implement integrators 1000 and 1004 using capacitive feedback via capacitors 1002 and 1006, respectively.

Figure 11:
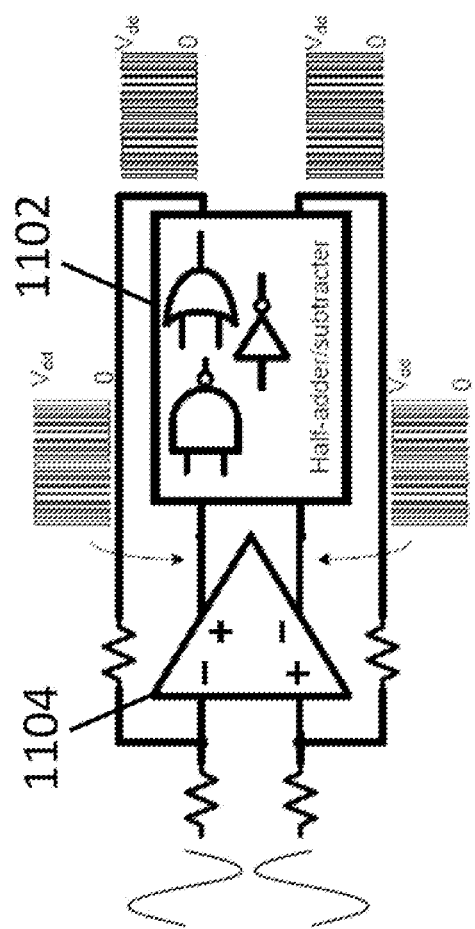
FIG. 11 illustrates an example of a circuit having a SMOA followed by combinatorial digital logic that implements a subtracter (or a digital half-adder) to suppress common mode components and relax the common mode rejection requirements on the first stage of the SMOA in accordance with some embodiments.

In some embodiments, combinatorial digital logic 1102 can be used to realize signal processing functions such as a subtracter (a digital half-adder) as shown in FIG. 11. The digital signals output by SMOA 1104 can be digitally subtracted in order to suppress any common mode components and relax the common mode rejection requirements on the first stage of the SMOA.

Figure 23:
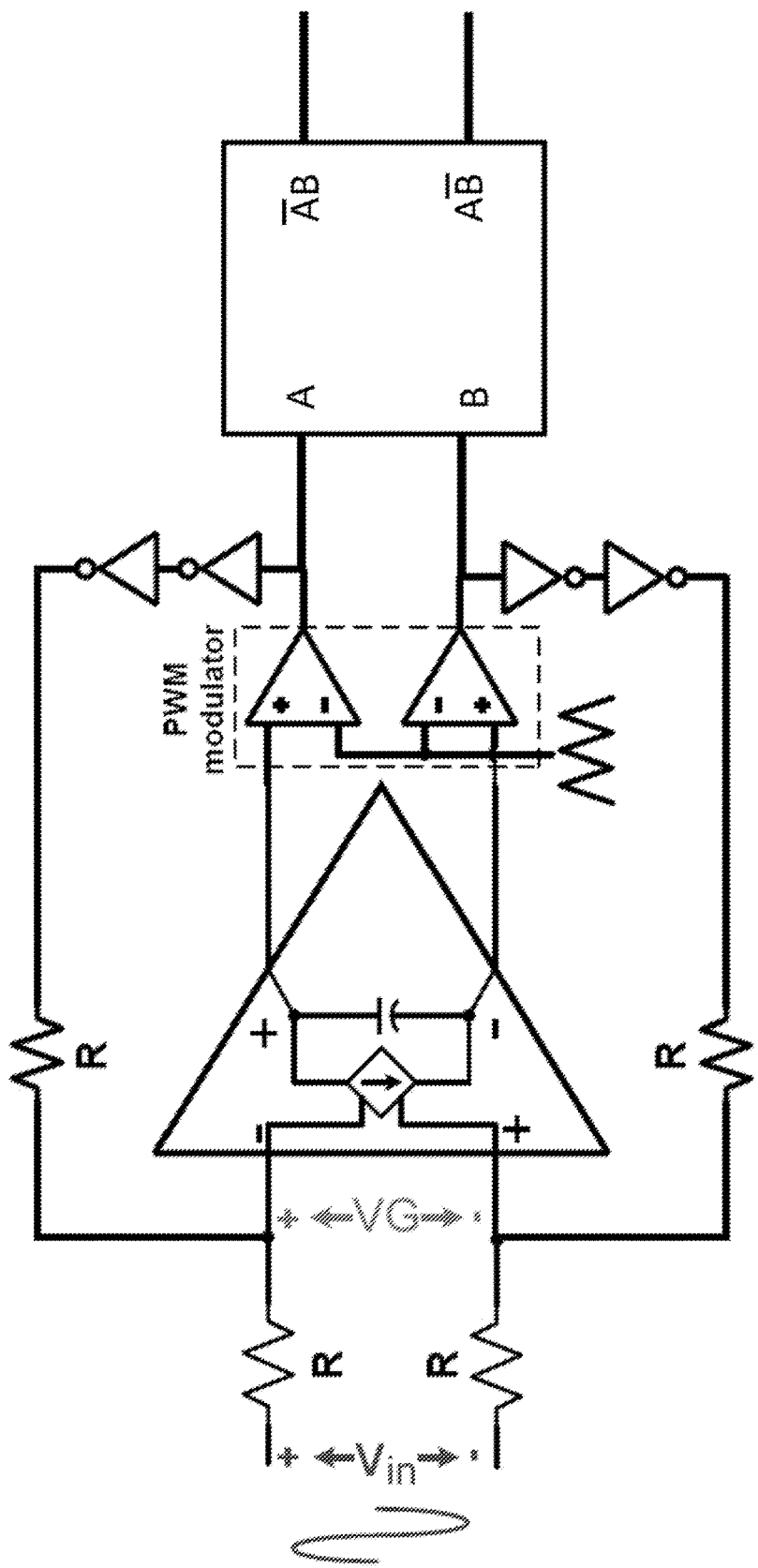
FIG. 23 illustrates an example of using digital logic at the output of a SMOA to improve common mode rejection in accordance with some embodiments.

For example, a use of digital logic to improve common mode rejection in a circuit including a SMOA is illustrated in FIG. 23 in accordance with some embodiments. As shown, this digital logic can receive the outputs of a differential SMOA at inputs A and B. The logic can then produce output $A\overline{B}$ and $\overline{A}B$, where $A\overline{B}$ represents a logical AND of A and an inverted B, and where $\overline{A}B$ represents a logical AND of B and an inverted A.

Figure 12:
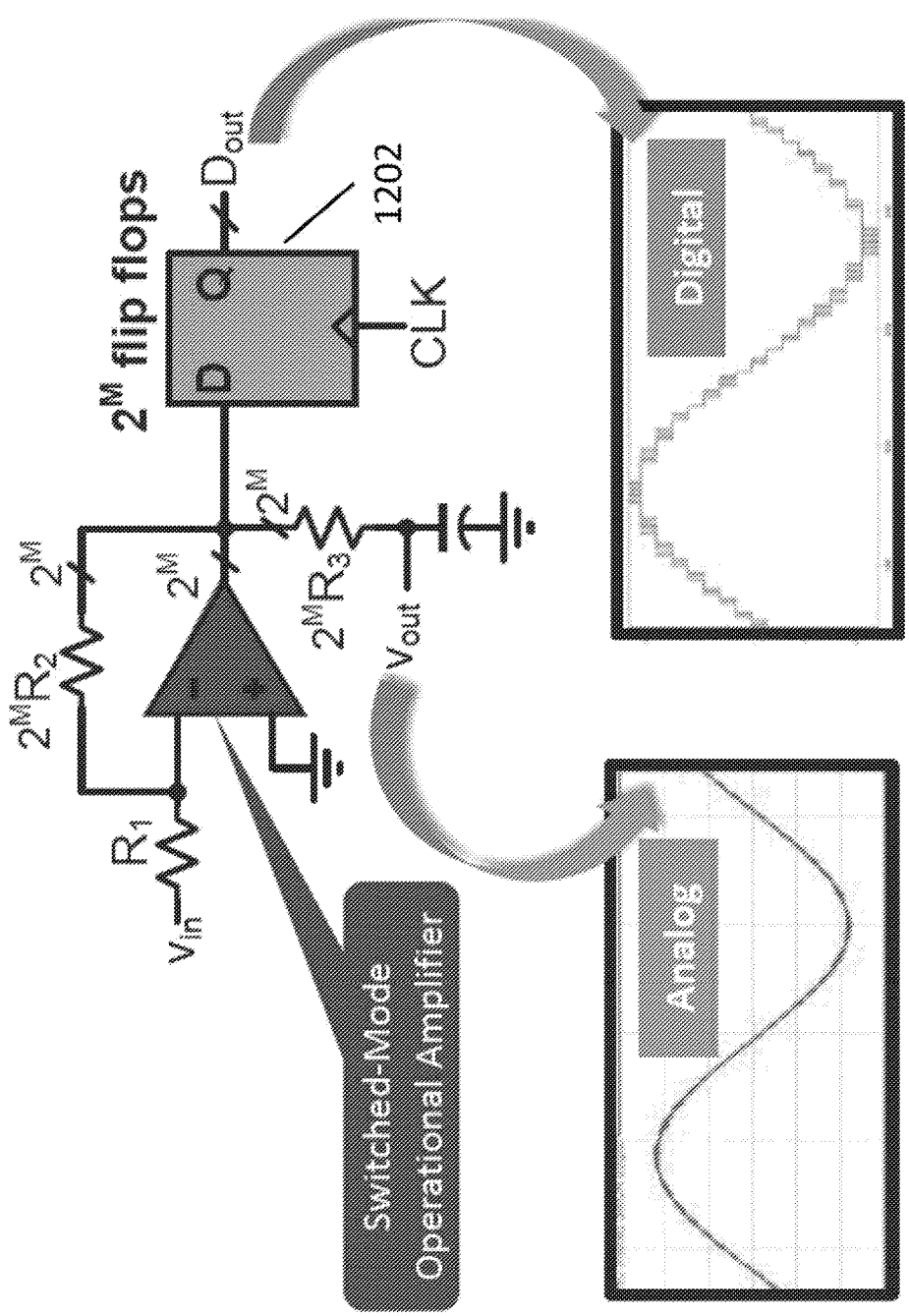
FIG. 12 illustrates conversion of signals output by a SMOA from the switched mode domain to the digital domain and analog domain in accordance with some embodiments.

Due to the rail-to-rail nature of the individual switched-mode signals produced by a SMOA, the conversion of the outputs of the SMOA to the digital domain can be performed by a time sampling operation of the outputs by use of D-Flip Flops 1202, as shown in FIG. 12. The reconstruction of the outputs of the SMOA to the analog domain can be performed by summing the outputs via equally sized output resistors.

Figure 21:
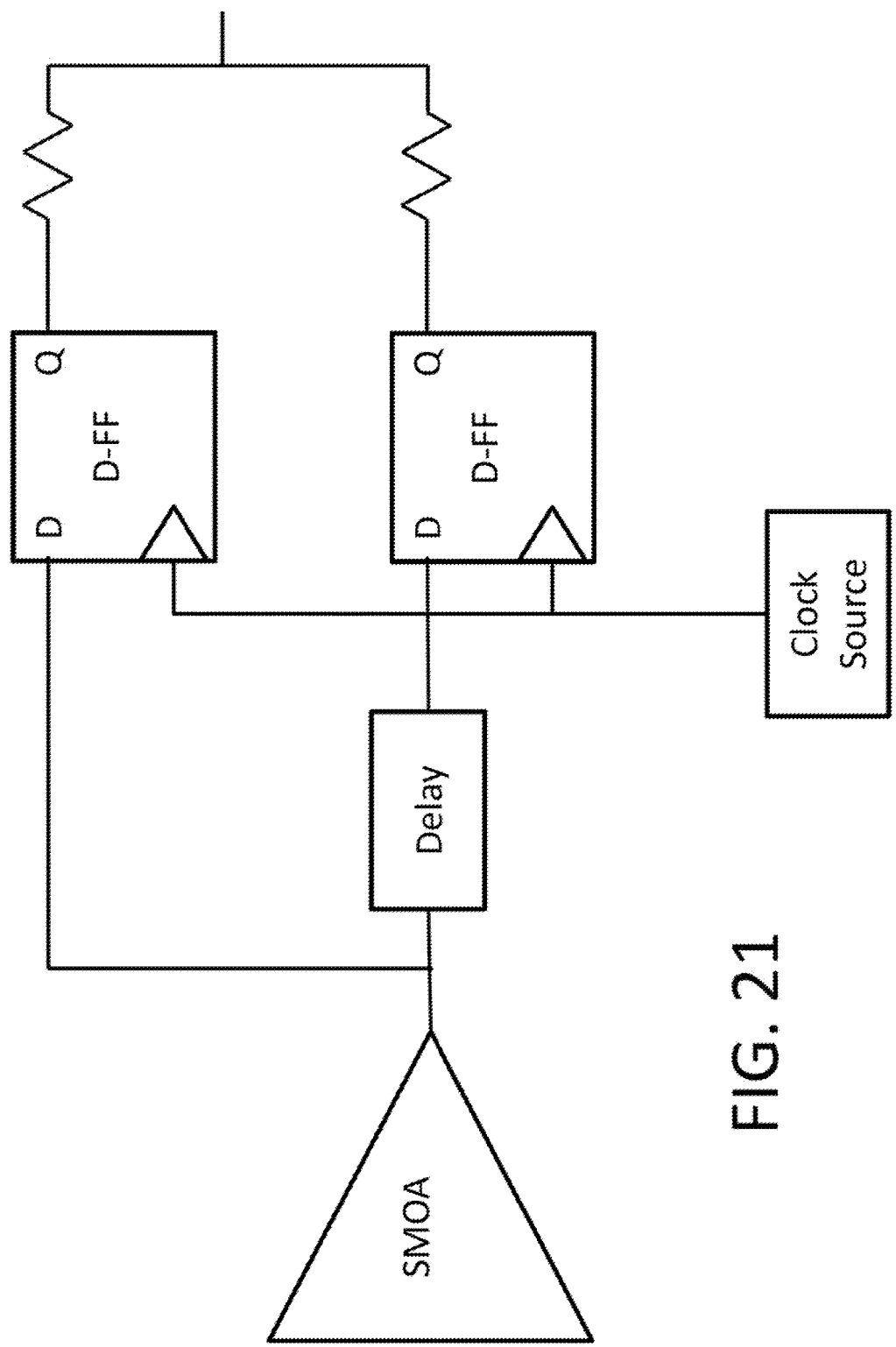
FIG. 21 illustrates an example of implementing FIR filtering along with a conversion to the digital domain in connection with a SMOA in accordance with some embodiments.
Figure 22:
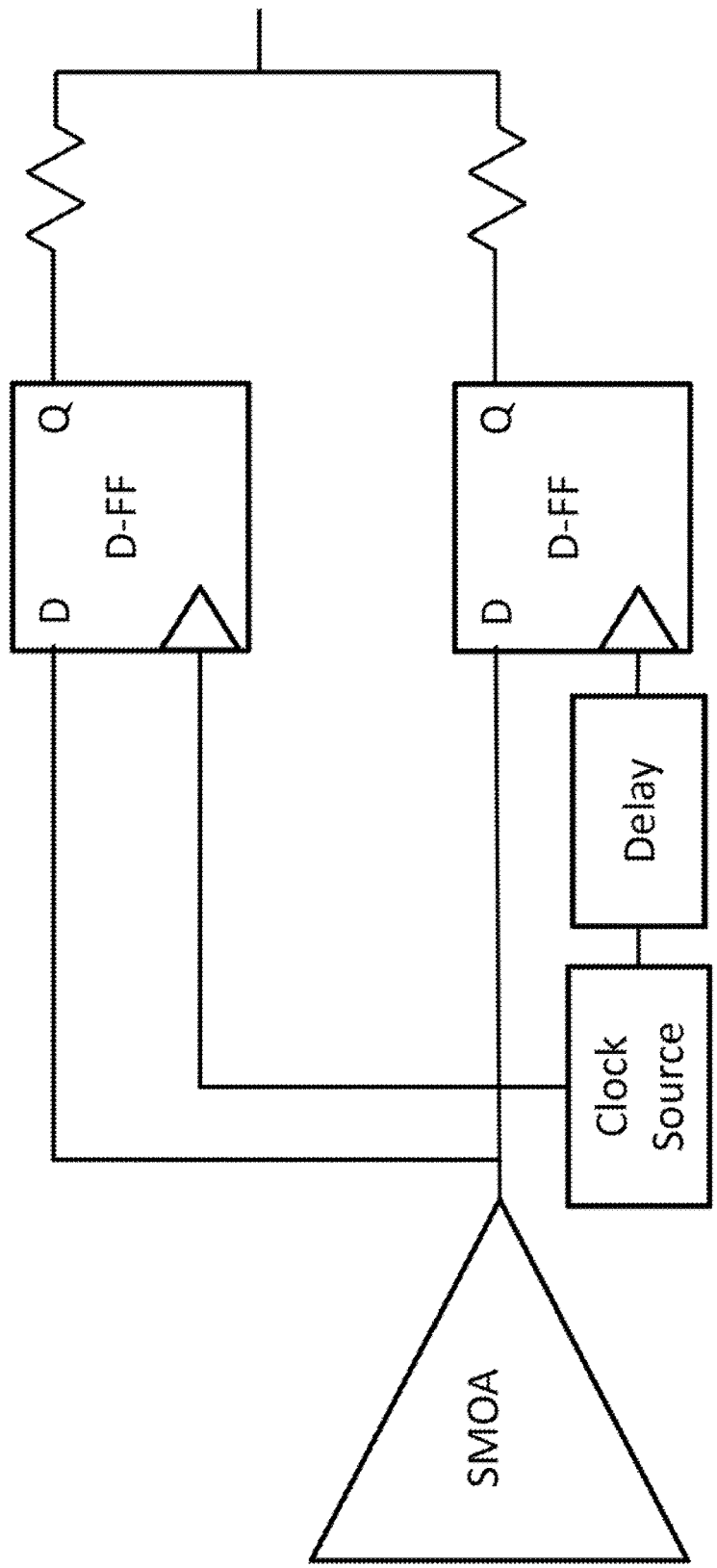
FIG. 22 illustrates another example of implementing FIR filtering along with a conversion to the digital domain in connection with a SMOA in accordance with some embodiments.

In some embodiments, as shown in FIGS. 21 and 22, FIR filtering, as described above in connection with FIGS. 6 and 7, can be implemented along with a conversion to the digital domain. As illustrated in FIG. 21, the output of a SMOA can be provided to one D-Flip-Flop with a delay and to another D-Flip-Flop without a delay. The delay introduced to the signal of one D-Flip-Flop effects FIR filtering in the combined output. In another approach, as shown in FIG. 22, the output of a SMOA can be provided to two D-Flip-Flops, a clock signal used to clock the D-Flip-Flops can be delayed with one of the D-Flip-Flops relative to the other. The delay introduced to the clock of one of the D-Flip-Flops effects FIR filtering in the combined output.

Figure 13:
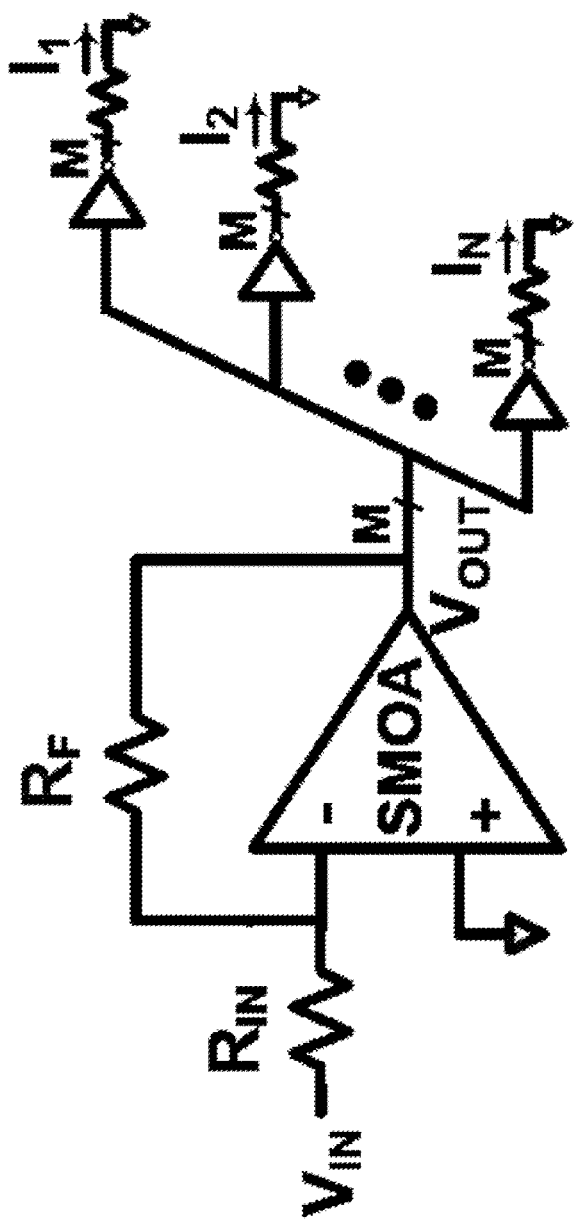
FIG. 13 illustrates an example of using parallel inverters to drive one or more loads based on the outputs of a SMOA in accordance with some embodiments.

In some embodiments, as described above, one or more inverters can be used at the output of a SMOA to drive one or more loads. As shown in FIG. 13, any suitable number of such inverters can be connected in series and/or in parallel from the output of the SMOA to one or more loads. For example, the output of a single inverter, whose input is connected to an output of a SMOA, can be connected to a series of parallel inverters, each with outputs connected to the same or to different loads. As another example, a series of parallel inverters, each with outputs connected to the same or to different loads, can have their inputs connected to the same SMOA output.

In accordance with some embodiments, a continuous-time pipelined analog to digital converter (ADC) can be implemented using one or more SMOAs.

Figure 14:
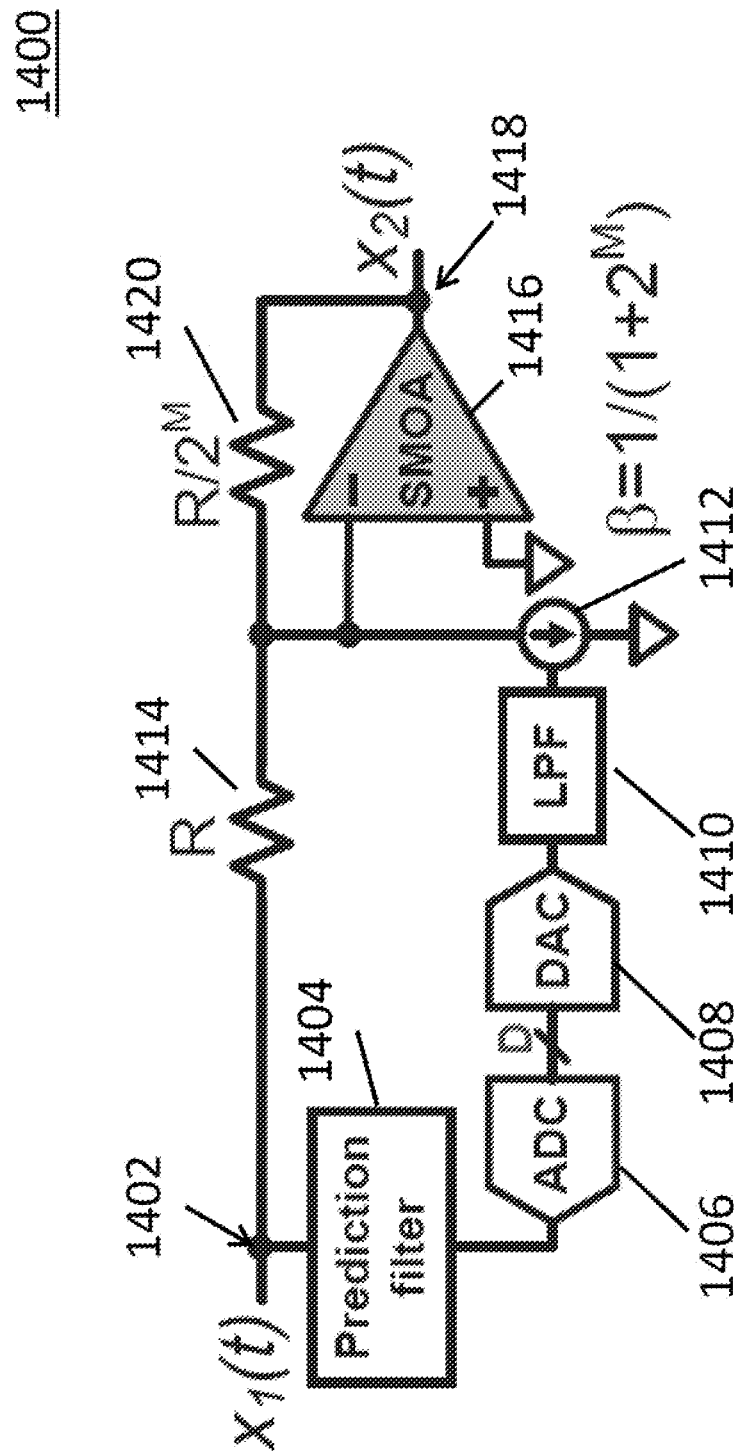
FIG. 14 illustrates an example of a continuous-time pipelined analog to digital converter (ADC) stage using a SMOA in accordance with some embodiments.

For example, FIG. 14 shows an example 1400 of a continuous-time pipelined ADC stage in accordance with some embodiments. As illustrated, an input signal $X_1(t)$ is received at node 1402. Prediction filter 1404 predicts upcoming values of the input signal to compensate for propagation delays in the path including components 1404, 1406, 1408, 1410, and 1412, and provides an input signal to low resolution analog to digital converter (ADC) 1406. ADC 1406 then converts its input signal to digital format, and digital to analog converter (DAC) 1408 converts the resulting signal back to analog format. The analog signal output by DAC 1408 is then filtered by low pass filter 1410, which filters out DAC replica components around the sampling frequency of the DAC. The output of the low pass filter then controls current source 1412 to cause a voltage drop across resistor 1414 so that a corresponding residue voltage is present at the input to SMOA 1416. SMOA 1416 then drives node 1418 to provide a stage output ($X_2(t)$) to the next pipelined ADC stage and to provide a feedback signal to the input of the SMOA via feedback resistor 1420.

Figure 15:
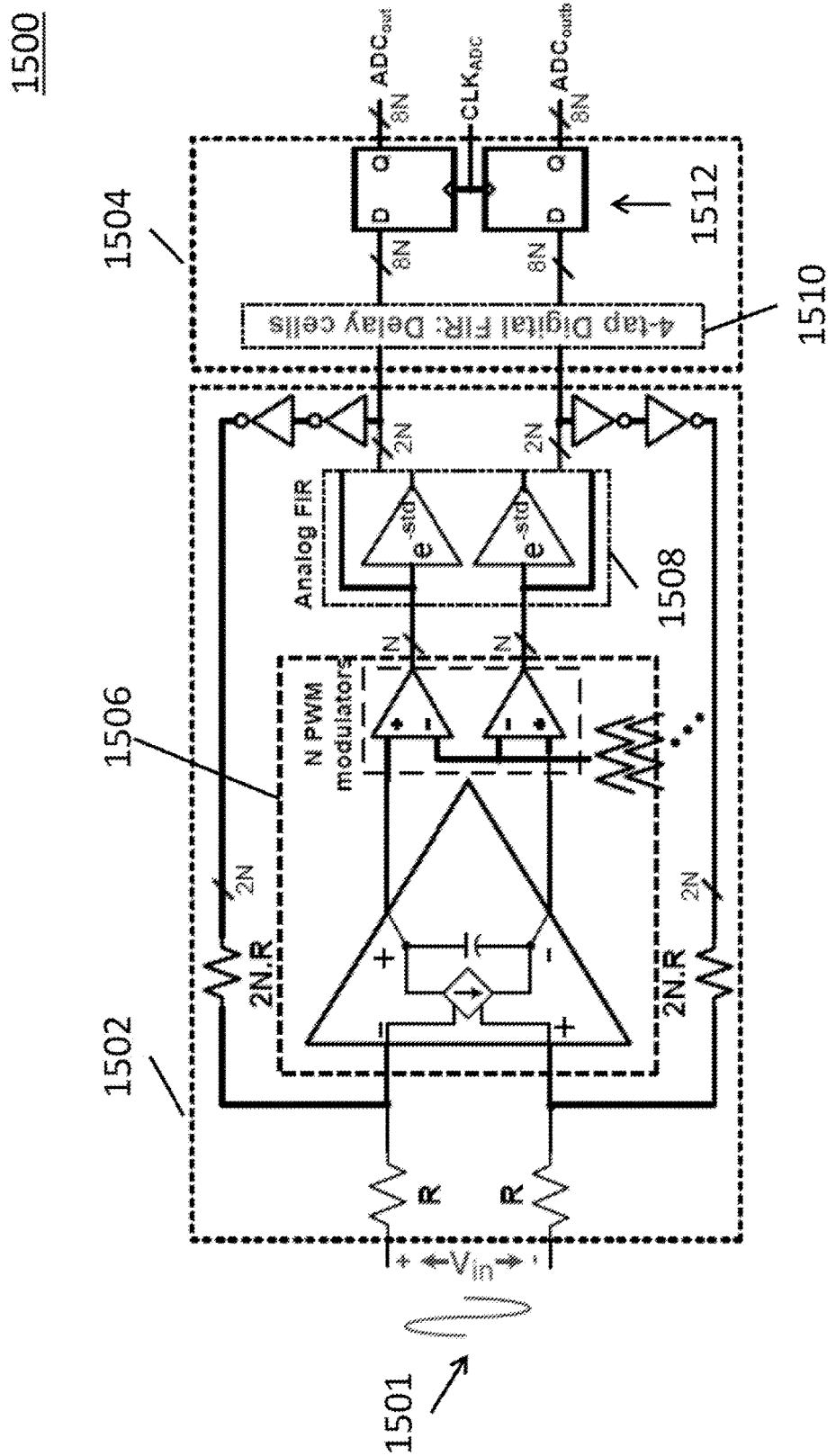
FIG. 15 illustrates an example of an analog to digital converter (ADC) including analog and digital FIR filters in accordance with some embodiments.

Turning to FIG. 15, another example 1500 of an analog to digital converter (ADC) including a SMOA in accordance with some embodiments is shown. As illustrated, ADC 1500 includes a first stage 1502 and a second stage 1504.

First stage 1502 converts the analog input 1501 to 2N binary outputs at the outputs of N analog FIR filters 1508. Half of these binary outputs are delayed by the FIR filter delay elements, and half are not, and the binary outputs reflect the frequency of the input signal ($f_{in}$), its harmonics ($kf_{in}$), and the PWM spurs ($mf_{PWM}+/-kf_{in}$). SM-to-digital sampling aliases the PWM spurs into the Nyquist band. Because the quantization noise is due to aliasing of PWM $f_{in}$ spurs, continuous time FIR filters 1510 are provided before D-Flip-Flop samplers 1512 to increase the ADC resolution. For example, with N=8, $f_{PWM}$=2 GHz, and a two-tap FIR filter 1508, the dominant driver output spurs are at K.4 GHz; when sampling, these spurs alias into the signal band and a 17-level ADC is obtained. To achieve variable resolution, an additional four-tap FIR filter 1510 at the driver output outside the feedback loop can be used to suppress the modulation spurs at odd multiples of 4 and 8 GHz moving the dominant spurs to K.16 GHz. In the time domain, due to the finite FIR notch bandwidths, the information is represented as 65 levels for slow varying signals before sampling and a 65-level ADC is realized.

Figure 16:
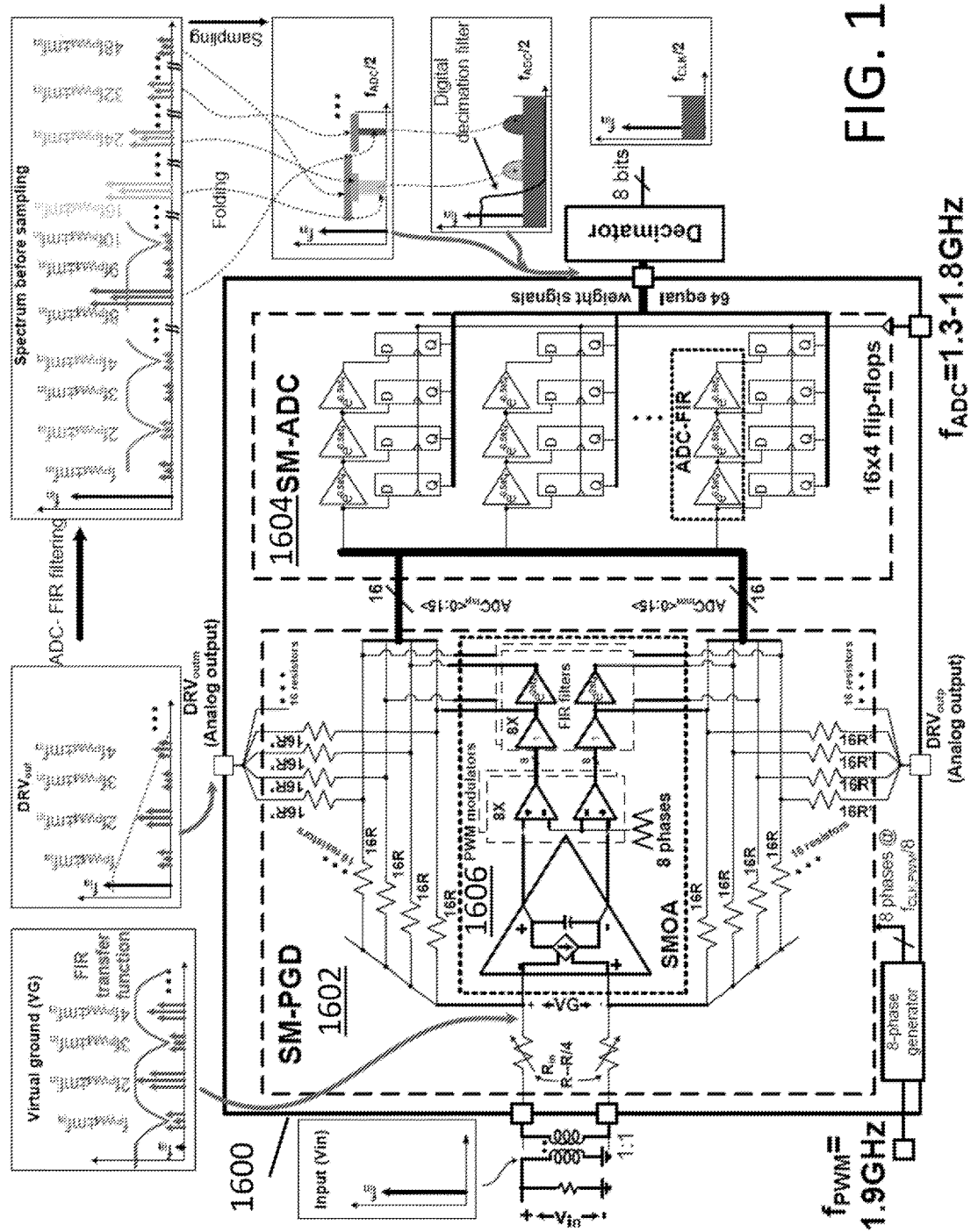
FIG. 16 illustrates an example of an ADC with a programmable gain driver in accordance with some embodiments.

Yet another example 1600 of an analog to digital converter (ADC) including a SMOA in accordance with some embodiments is shown in FIG. 16. As illustrated, the ADC includes an SM-PGD portion 1602 forming a programmable gain driver (PGD) and a SM-ADC portion 1604.

The PGD uses a SMOA 1606 with resistive feedback. The SMOA's first stage is a common-source amplifier; the class-D output stage uses natural Pulse Width Modulation (PWM) for analog-to-binary-level conversion. The SMOA output has PWM modulation spurs in sidebands around the modulation frequency ($f_{PWM}$). When in feedback, the low frequency output of the SMOA matches that of an OTA; the PWM spurs are not suppressed but are ignored by the feedback when $f_{PWM} \gg f_{UGB}$, the amplifier unity-gain frequency. Because of the class-D output stage, the maximum allowed output swing (MAS) is $V_{ppd}=2V_{dd}(1-2t_{min}f_{PWM})$, where $t_{min}$ is width of the smallest pulse that can be propagated; in nanoscale CMOS $V_{ppd} \approx 2V_{dd}$. The large MAS relaxes noise and power requirements of the first stage.

Figure 17:
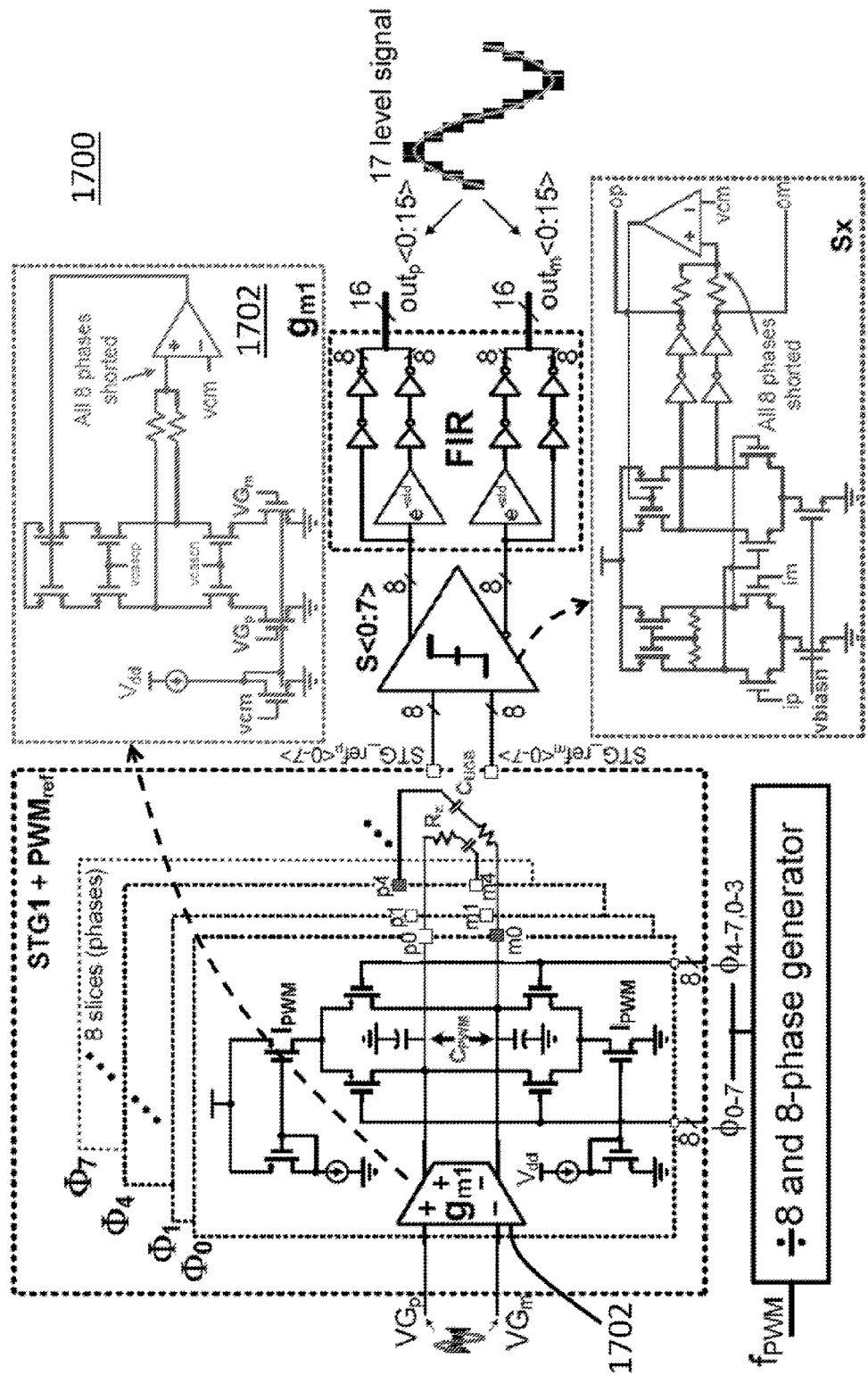
FIG. 17 illustrates an example of a SMOA that can be used in the circuit of FIG. 16 in accordance with some embodiments.
Figure 18:
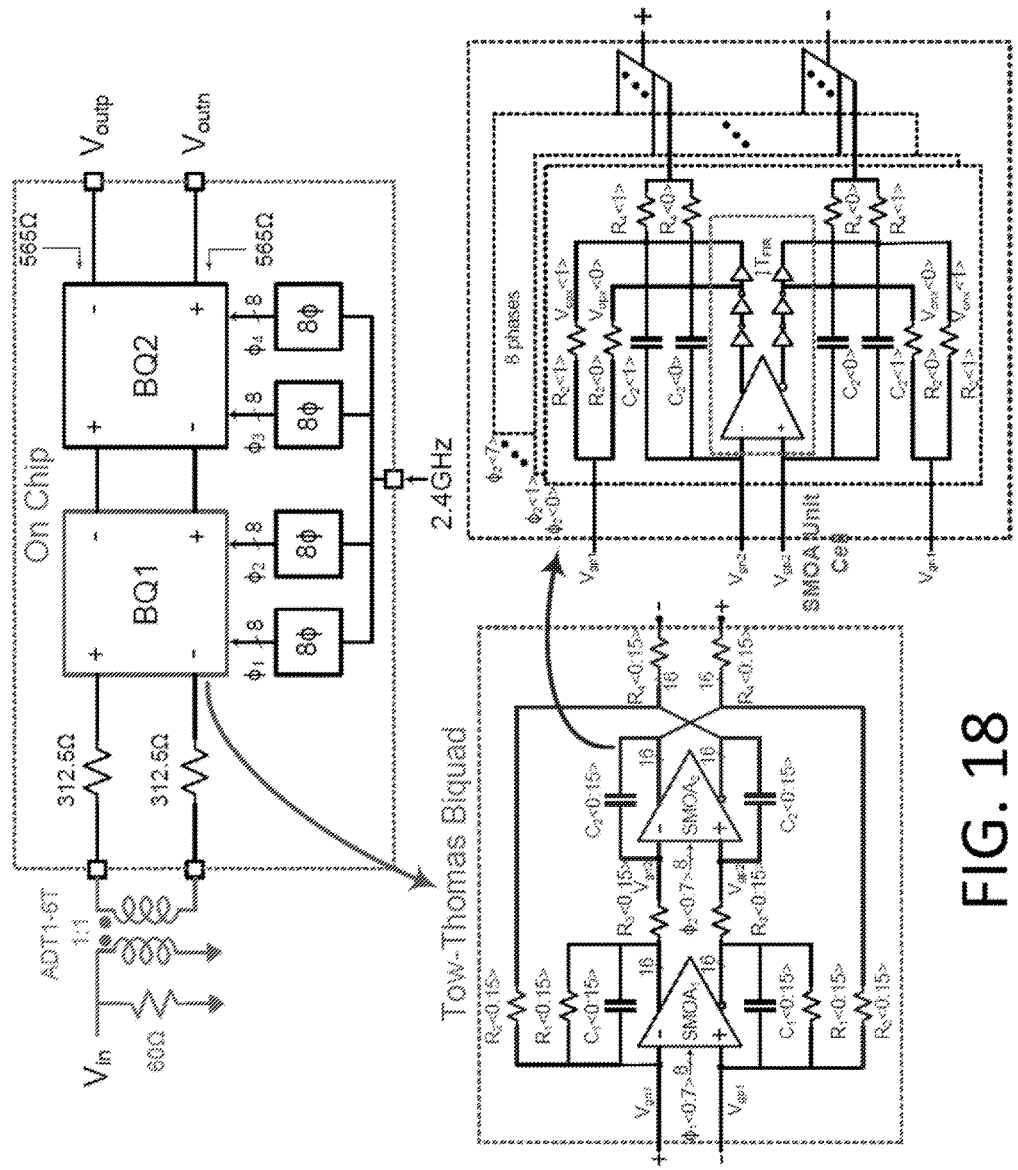
FIG. 18 illustrates an example of a fourth order continuous-time Butterworth filter including two Tow-Thomas Biquads, which each include two eight-phase SMOAs (SMOA1 and SMOA2), in accordance with some embodiments.

SMOA 1606 of FIG. 16 can be implemented as shown by SMOA 1700 of FIG. 17 in accordance with some embodiments. As illustrated, a pseudo-differential, body-biased, common source transconductor ($g_{m1}$) 1702 with local common mode feedback (CMFB) converts the virtual-ground voltage (VG) to a current, to which a switching differential pair adds a square-wave current ($\pm I_{PWM}$) at $f_{PWM}$/N. Both currents are integrated because of the high DC gain of $g_{m1}$, resulting in a voltage (STG_ref) $(V_{ref}/A_{PWM})r(t)+(g_{m1}/(C_{PWM}+2C_{UGB}))\int VGdt$ where the first term is the PWM modulator's reference with r(t) a 50%±1 triangular wave and a second-stage gain of $A_{PWM}=V_{ref}f_{PWM}C_{PWM}/NI_{PWM}$, when switched between 0 and $V_{ref}$. $V_{ref}(=V_{dd}$ in this embodiment) is the ADC reference and supplies mostly DC current since the feedback network and the load are resistive. The capacitors for setting the unity gain bandwidth (UGB) and for the PWM modulator can be independently controlled by placing the capacitors $C_{UGB}$ across differential slices (Φ0 & Φ4|Φ1 & Φ5| . . . ) so that the PWM ramps occur in common mode. By adding a series resistance Rz to $C_{UGB}$, a zero is placed in the SMOA loop gain to improve the phase margin. STG_ref is sliced differentially using a cascade of differential amplifiers (S<x>, x=0-7), resulting in pseudo-differential CMOS signals kept at a common mode of $V_{dd}/2$ by a local CMFB loop. The FIR delay cells are tunable, current-starved inverters and the 16 binary signals are buffered with strong inverters before driving the feedback and forward resistors. The 16 binary signals are resistively combined and brought out at the analog output $DRV_{out}$.

In accordance with some embodiments, a fourth order continuous-time Butterworth filter including two Tow-Thomas Biquads, which each include two eight-phase SMOAs (SMOA1 and SMOA2), can be provided. The eight clock phases can be generated on-chip by dividing an externally fed 2.4 GHz clock by eight in some embodiments.

Each of the SMOAs is made of eight identical unit cells in parallel, each operating on a different clock phase ϕ<0:7> to implement the eight-phase PWM modulator. Each unit cell includes a transconductor $G_{m1s}$, followed by the PWM modulator. The $G_{m1s}$s are sized appropriately for noise requirements. The PWM reference ramp is generated by charging and discharging a capacitor, connected to the output of $G_{m1s}$, using a current steering differential pair. The output signal current of $G_{m1s}$ is steered to the same capacitor. The PWM modulator is a continuous-time comparator, implemented as a cascade of three differential pairs, followed by inverters to drive the output load.

The closed loop UGB for the SMOA integrators is designed to be around 400 MHz. The eight-phase PWM modulator runs at 300 MHz, pushing the first modulation spur to 2.4 GHz. In some embodiments, the eight phases are tunable with programmable delays cells to enable calibration for phase mismatches between the PWM modulators. One-tap FIR filtering is further performed with delay cells at the output of each phase resulting in 16 signal streams. The delays are tuned to create a notch at 2.4 GHz for the combined output, so that the first significant modulation spur occurs at 4.8 GHz. In a phase and gain matched eight-phase PWM system, the output of the SMOA can be followed by a simple RC low-pass filter to attenuate the 4.8 GHz component, thus providing a very linear broadband spectrum. To enable operation down to 0.6V, $G_{m1s}$ is implemented as a pseudo-differential telescopic OTA, without a tail-current source, but the bias current is controlled by body-mirroring. A digitally tunable series RC at the output of $G_{m1s}$ forms the dominant pole and a stabilizing zero. The UGB-limiting capacitors at the output of $G_{m1s}$ are connected to appear in common-mode for the PWM current source, but in differential-mode for the input signal, so that a smaller, lower noise PWM current can be used. The PWM clock phases ϕ<0,3>, ϕ<1,4>, etc. are 180 degrees out of phase, and by connecting the UGB-capacitors between the nodes $V_{opi}$<0>, $V_{oni}$<3> and $V_{opi}$<3>, $V_{oni}$<0>, they do not load the PWM current source, while the input signal path remains unchanged.

In some embodiments, mismatches between multiple phases of a SMOA can lead to imperfect cancellation of modulation spurs at multiples of the PWM modulation frequency. For example, mismatches in the gains of the first stage of the SMOAs, mismatches in the gains of the PWM modulators of the SMOAs (e.g., caused by mismatches in the amplitudes of the triangular reference waveforms), mismatches in the offsets in each first stage of the SMOAs, mismatches in the offsets in the modulator slicers of the SMOAs, and mismatches in the timing in the propagation of the PWM reference waveforms constitute some of the sources of these mismatches.

Figure 20:
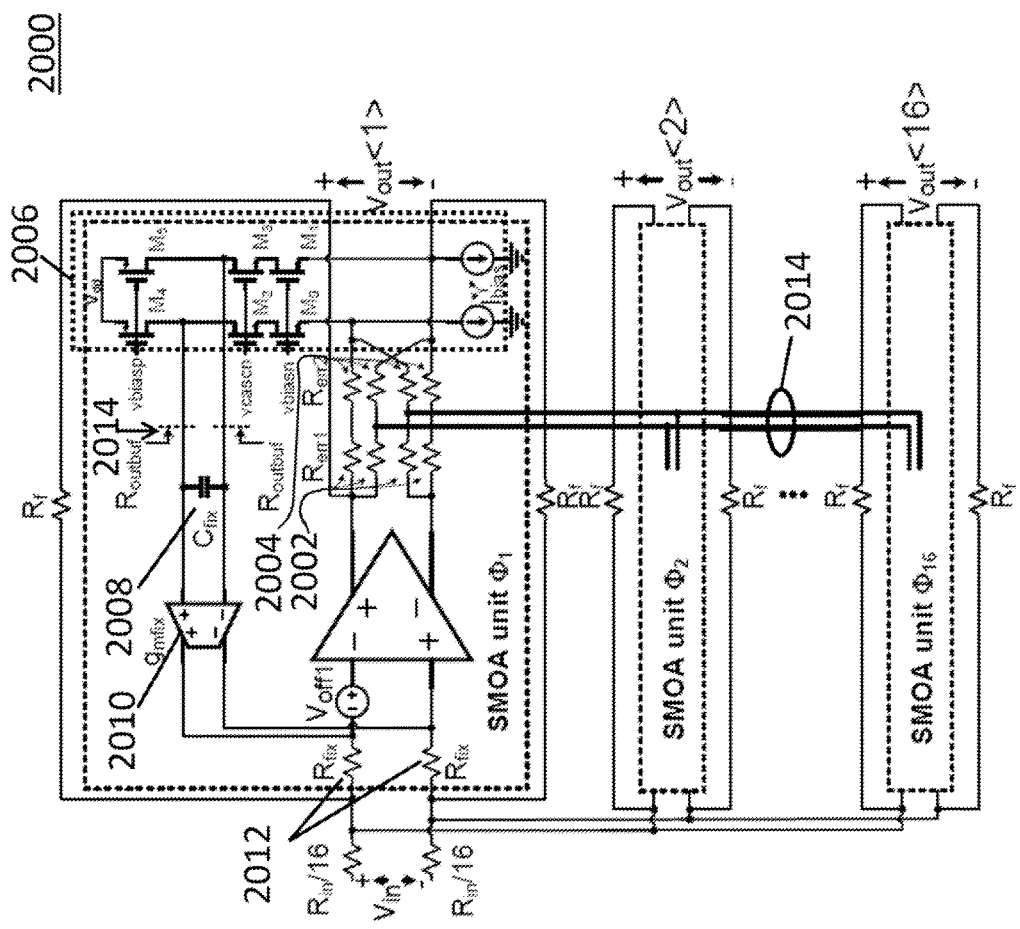
FIG. 20 illustrates an example of a SMOA circuit that compensates for mismatches in different phase components of the SMOA circuit in accordance with some embodiments.

FIG. 20 illustrates an example 2000 of a SMOA including circuits for compensating for such mismatches in accordance with some embodiments. As shown, SMOA 2000 is a 16-phase SMOA that uses resistor $R_{err1}$ 2002 and $R_{err2}$ 2004 to generate an error current reflective of the error caused by the above-described mismatches. In the $i^{th}$ phase of the SMOA, the error current generated by $R_{err1}$ and $R_{err2}$ can be shown to be:

$$\frac{v_{outp}\langle i\rangle}{R_{err1}+R_{err2}}+\frac{\Sigma_j v_{outm}\langle j\rangle/16}{R_{err1}+R_{err2}}=\frac{v_{out}\langle i\rangle-\Sigma_j v_{outm}\langle j\rangle/16}{R_{err1}+R_{err2}}.$$

The error current is fed into a current buffer 2006 (having transistors M0-M5 and current sources $I_{bias}$) and is integrated and amplified on capacitor $C_{fix}$ 2008. The amplified error is converted to a voltage ($v_{fix}$<i>) through the transconductor $g_{mfix}$ 2010 and resistor $R_{fix}$ 2012. In the absence of other mismatches, the suppression of the offsets is limited by the smallest output impedance achievable out of the current buffer, $R_{outbuf}$ 2014. This limits the gain of the error amplifier at very low frequencies to $R_{outbuf}/(R_{err1}+R_{err2})$ and hence the residual output offset at the $i^{th}$ phase output of the SMOA to approximately $v_{off}\langle i\rangle(R_{err1}+R_{err2})/(g_{mfix}R_{fix}R_{outbuf})$.

It should be understood that the connections shown in SMOA unit $\Phi_1$ of FIG. 20 would be similarly made in SMOA units $\Phi_2$-$\Phi_{16}$. For example, connections 2014 would be similarly connected to resistors $R_{err1}$+$R_{err2}$ in SMOA units $\Phi_2$-$\Phi_{16}$ to the manner in which they are made in SMOA unit $\Phi_1$ as shown in FIG. 20.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims which follow. Features of the disclosed embodiments can be combined and rearranged in various ways.

What is claimed is:

1. A circuit comprising:
   a first differential transconductor having a first input that receives a first square wave, a second input that receives a second square wave, a first output, and a second output, wherein the second square wave is 180 degrees out of phase from the first square wave;
   a second differential transconductor having a first output coupled to the first output of the first differential transconductor and a second output coupled to the second output of the first differential transconductor;
   a differential comparator having a first input coupled to the first output of the first differential transconductor and a second input coupled to the second output of the second differential transconductor; and
   at least one capacitor coupled between the first output of the first differential transconductor and the second output of the second differential transconductor.

2. A circuit comprising:
   a first differential transconductor having a first input that receives a first square wave, a second input that receives a second square wave, a first output, and a second output, wherein the second square wave is 180 degrees out of phase from the first square wave;
   a second differential transconductor having a first output coupled to the first output of the first differential transconductor and a second output coupled to the second output of the first differential transconductor;
   a differential comparator having a first input coupled to the first output of the first differential transconductor, a second input coupled to the second output of the second differential transconductor, and an output; and
   a flip flop with a data input coupled to the output of the differential comparator and a clock input coupled to a clock signal.

3. A circuit comprising:
   a first differential transconductor having a first input that receives a first square wave, a second input that receives a second square wave, a first output, and a second output, wherein the second square wave is 180 degrees out of phase from the first square wave;

a second differential transconductor having a first output coupled to the first output of the first differential transconductor and a second output coupled to the second output of the first differential transconductor;

a differential comparator having a first input coupled to the first output of the first differential transconductor, a second input coupled to the second output of the second differential transconductor, and a differential comparator output;

a delay device coupled to the output of the differential comparator output that produces a delayed output;

a first flip flop having a data input coupled to the differential comparator output and a clock input coupled to a clock signal; and a second flip flop having a data input coupled to the delayed output and a clock input coupled to the clock signal.

4. A circuit comprising:

a first differential transconductor having a first input that receives a first square wave, a second input that receives a second square wave, a first output, and a second output, wherein the second square wave is 180 degrees out of phase from the first square wave;

a second differential transconductor having a first output coupled to the first output of the first differential transconductor and a second output coupled to the second output of the first differential transconductor;

a differential comparator having a first input coupled to the first output of the first differential transconductor, a second input coupled to the second output of the second differential transconductor, and a differential comparator output;

a first flip flop having a data input coupled to the differential comparator output and a clock input coupled to a first clock signal; and a second flip flop having a data input coupled to the differential comparator output and a clock input coupled to a second clock signal that is phase shifted with respect to the first clock signal.

* * * * *